(12) United States Patent
Lin

(10) Patent No.: US 12,513,962 B2
(45) Date of Patent: Dec. 30, 2025

(54) SEMICONDUCTOR DEVICE WITH FLEXIBLE SHEET STRUCTURE

(71) Applicant: Taiwan Semiconductor Manufacturing Company, Ltd., Hsinchu (TW)

(72) Inventor: Chun-Yen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 741 days.

(21) Appl. No.: 17/834,694

(22) Filed: Jun. 7, 2022

(65) Prior Publication Data

US 2023/0163196 A1 May 25, 2023

Related U.S. Application Data

(60) Provisional application No. 63/283,108, filed on Nov. 24, 2021.

(51) Int. Cl.
*H10D 64/01* (2025.01)
*H10D 30/01* (2025.01)
*H10D 30/62* (2025.01)
*H10D 84/01* (2025.01)
*H10D 84/03* (2025.01)

(52) U.S. Cl.
CPC ......... *H10D 64/017* (2025.01); *H10D 30/024* (2025.01); *H10D 30/6211* (2025.01); *H10D 84/0158* (2025.01); *H10D 84/038* (2025.01); *H10D 30/6219* (2025.01)

(58) Field of Classification Search
CPC ............ H10D 30/024; H10D 30/6211; H10D 30/6219; H10D 64/017; H10D 84/0158; H10D 84/0193; H10D 84/038
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |

(Continued)

FOREIGN PATENT DOCUMENTS

| TW | I581336 B | 5/2017 |
| TW | 202025394 A | 7/2020 |

*Primary Examiner* — Brook Kebede
(74) *Attorney, Agent, or Firm* — HAYNES AND BOONE, LLP

(57) ABSTRACT

Semiconductor structures and the manufacturing method thereof are disclosed. An exemplary manufacturing method includes patterning a top portion of a substrate, thereby forming a fin-like structure protruding from the substrate, forming a dummy gate structure across the fin-like structure, the dummy gate structure being directly above the first portion and the second portion of the fin-like structure, recessing the fin-like structure with the dummy gate structure as an etch mask, thereby forming recesses on both sides of the dummy gate structure, growing epitaxial features in the recesses, and replacing the dummy gate structure with a metal gate structure. The fin-like structure has a first portion with a first width and a second portion with a second width that is smaller than the first width. The metal gate structure engages both the first portion and the second portion of the fin-like structure.

20 Claims, 25 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2008/0059916 A1* | 3/2008 | Chang .................. H10D 84/907 716/120 |
| 2015/0263172 A1* | 9/2015 | Cho ....................... H10D 30/62 257/401 |
| 2015/0303198 A1* | 10/2015 | Ching ............... H01L 21/02236 257/192 |
| 2020/0274000 A1 | 8/2020 | Xie et al. |
| 2021/0202465 A1 | 7/2021 | Wang et al. |
| 2021/0272957 A1 | 9/2021 | Lee et al. |

\* cited by examiner

SEMICONDUCTOR DEVICE WITH FLEXIBLE SHEET STRUCTURE

PRIORITY DATA

This application claims priority to U.S. Provisional Patent Application No. 63/283,108, filed on Nov. 24, 2021, entitled "Semiconductor Device with Flexible Sheet Structure", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate device generally refers to a device having a gate structure (also known as gate stack), or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

In demand of lower power and faster speed, it is driven to continuous improvement of transistor architectures. However, advanced FinFET structure is no longer suitable to control short channel effect (SCE) and other device limitation of compact logic circuits beyond sub-A scales. MBC structure provides a relatively lower subthreshold swing (SS) values in comparison to FinFET and becomes a next generation spotlight. However, there are challenges to implementing such IC fabrication flow, especially with scaled down IC features in advanced process nodes. One challenge is how to make the best use of the sheet structure in the MBC transistors to create more flexible device design, such as providing extra performance-power-area (PPA) benefits. Therefore, while existing MBC transistors are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
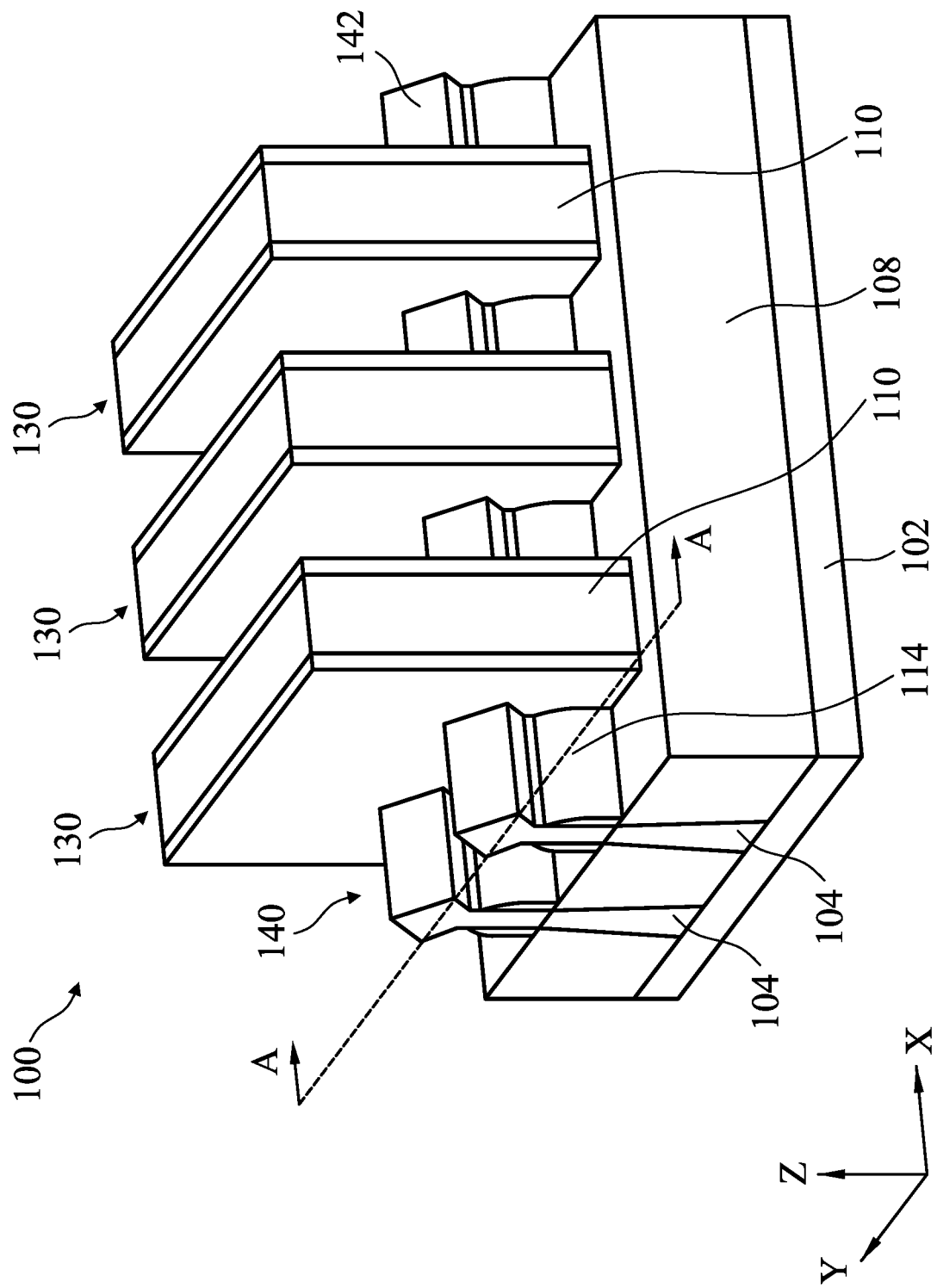
FIG. 1 is a perspective view of a semiconductor device, according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to providing a flexible sheet structure in multi-bridge-channel (MBC) transistors. The term "flexible" refers to a sheet structure having different sheet widths at different segments of a continuous sheet other than a constant sheet width, and thus providing different channel region widths to the MBC transistors. For example, gate structures are disposed on the segments to form a plurality of MBC transistors with different channel region widths, as well as different source/drain feature widths. The larger the channel region width, the stronger current drive performance is provided to the respective transistors, and accordingly faster operational speed. The smaller the channel region width, the less leakage current is associated with the respective transistors, and accordingly better power efficiency. Therefore, one flexible sheet structure may suit different needs of forming different transistors thereon to provide extra performance-power-area (PPA) benefits.

Embodiments of the present disclosure may be implemented to advance semiconductor devices that may include multi-gate devices. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Embodiments of the present disclosure are described using an MBC transistor structure with a channel region in a sheet-like shape (e.g., nanosheets), which is for illustration purpose only and should not be construed as limiting the scope of the present disclosure; for example, the present disclosure may also be applicable to channel region in other shapes, such as bar shape or other nanostructures.

The various aspects of the present disclosure will now be described in more details with reference to the figures.

Referring to FIG. 1, a perspective view of an example semiconductor device 100 (or device 100) is illustrated. The device 100 includes n-type FETs (NFETs) and/or p-type FETs (PFETs). The device 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The device 100 also includes one or more fin structures 104 (e.g., Si fins) that extend from the substrate 102 in the Z-direction. The fin structures 104 are elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed in a fin formation process, such as a double-patterning lithography (DPL) process. DPL is a method of constructing a pattern on a substrate by dividing the pattern into two interleaved patterns. DPL allows enhanced feature (e.g., fin) density. The fin structures 104 define active regions of the device 100, which include channel regions 130 under the gate stacks 110 and source/drain regions 140 on both sides of the gate stacks 110. The source/drain regions 140 include epitaxially-grown material 142 above the fin structures 104. In some embodiments, for an NFET, the epitaxially-grown material may include SiP, SiC, SiPC, SiAs, Si, or combinations thereof. In some embodiments, for a PFET, the epitaxially-grown material may include SiGe, SiGeC, Ge, Si, a boron-doped material, or combinations thereof. The epitaxially-grown material 142 is also referred to as epitaxial S/D features 142.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108. In other words, a portion of the fin structure 104 is embedded in the isolation structure 108. The isolation structure 108 prevents electrical interference or crosstalk.

The device 100 further includes gate stacks 110 elongated in the Y-direction. The gate stack 110 includes a gate electrode and a gate dielectric layer (not shown) below the gate electrode. The gate dielectric layer includes a dielectric material, such as silicon oxide, germanium oxide, high-k dielectric material layer or a combination thereof. Examples of high-k dielectric material include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. In another embodiment, the gate dielectric layer includes an interfacial layer (such as a silicon oxide or germanium oxide layer) and a high-k dielectric material layer on the interfacial layer. The gate electrode includes a conductive material layer, such as doped polycrystalline silicon (polysilicon), metal, metal alloy or combinations thereof.

The gate stacks 110 may be formed by a procedure that includes forming a gate dielectric layer, forming a gate electrode layer on the gate dielectric layer, and patterning the gate electrode layer and the gate dielectric layer. The formation of the gate stacks 110 may further include a gate replacement procedure to replace the previously formed gate stack with high-k dielectric and metal. The gate replacement may include a gate last operation or a high-k last operation where both gate dielectric and gate electrode are replaced at a later fabrication stage. The gate stacks 110 may also include gate spacers 114 formed on sidewalls of the gate stacks 110 by a procedure that includes deposition and anisotropic etch. During the forming of the gate spacers 114, the dielectric material of the gate spacers 114 may also be deposited on sidewalls of the fin structure 104 and surround the fin structure 104 in the X-direction.

Figure 2:
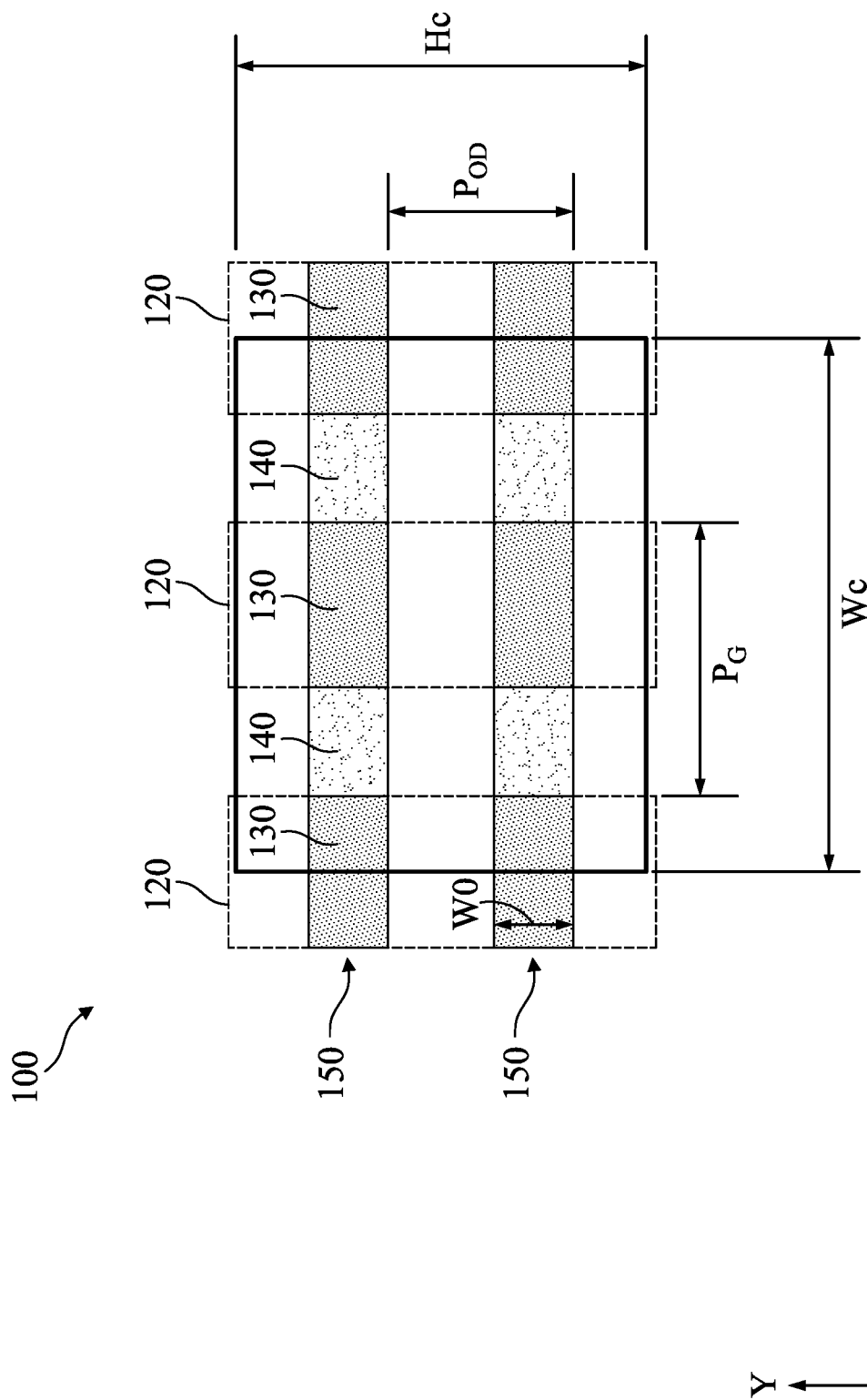
FIG. 2 is a layout or a plan view of the semiconductor device in FIG. 1, according to one or more aspects of the present disclosure.

Each of the gate stacks 110 defines a channel region 130 underneath. The channel region 130 is sandwiched by the two source/drain regions 140 on both sides of the gate stacks 110. Not depicted in FIG. 1 is that the channel region 130 includes vertically stacked channel members (or referred to as channel layers) connecting the two adjacent epitaxial S/D features 142 (FIG. 2 shows a cross-sectional view in X-Y plane that cuts through one of the channel members). Each of the channel members is surrounded by a gate stack 110 on its 4-sides. The channel members may include single crystalline silicon. Alternatively, the channel members may include germanium, silicon germanium, or another suitable semiconductor material(s). Initially, the channel members are formed as part of a semiconductor layer stack that includes the channel members and other semiconductor layers of a different material. The semiconductor layer stack is formed above the substrate 102 and patterned into a fin-like structure above the fin structure 104 during the fin formation process. The fin structure 104 is also referred to as fin base 104. During the gate replacement process, the semiconductor layer stack is selectively etched to remove the other semiconductor layers, leaving the channel members suspended over the fin base 104 and connecting the respective epitaxial S/D features 142. The channel members are separated from each other with vertical spacing (or referred to as gaps) therebetween. The gate stack 110 is subsequently filled in the vertical spacing and wrapping around the channel members.

FIG. 2 is a layout or a plan view along the A-A line of the device 100 in FIG. 1. FIG. 2 illustrates that the device 100 includes active regions 150 elongated in the X-direction and gate regions 120 elongated in the Y-direction which are generally perpendicular to the active regions 150. The active regions 150 are spaced apart from each other along the Y-direction with an active region pitch POD. The gate regions 120 are spaced apart from each other along the X-direction with a gate pitch PG. Each intersection of the active regions 150 and the gate regions 120 defines a channel region 130 between a pair of S/D regions 140. Each gate region 120 engages the channel region 130 of the respective active region 150 and is to form a transistor. In the illustrated embodiment, the S/D regions 140 are common S/D regions shared by two adjacent transistors. The gate stacks 110 (and gate spacers 114) are formed in the gate regions 120. The epitaxial S/D features 142 are formed in the S/D regions 140. The vertically stacked channel members are formed in the channel regions 130. In the depicted embodiment, the channel member is a sheet structure, also referred to as nanosheet structure for its nano scale. In various embodiments, the channel member may include cylindrical shape (e.g., nanowire), rectangular shape (e.g., nanobar), sheet shape (e.g., nanosheet), or have other suitable shapes. In the plane view of FIG. 2, the active region 150 has a rectangular shape elongated in the X-direction with generally constant width W0 along the Y-direction.

Also illustrated in FIG. 2 is a standard cell represented by the rectangular box 160 (also referred to as standard cell 160). The standard cell 160 represents a unit region, and multiples (e.g., replicates) of the standard cell 160 can be placed and routed such that different areas of an integrated circuit can have identical or similar configurations. That is, the standard cell 160 serves as a building block or tile to form a larger layout. For example, the standard cell 160 may be replicated in the X-direction and in the Y-direction to form more active regions 150 spaced apart along the Y-direction and continuously extending in the X-direction through a series of standard cells 160. The standard cell 160 has a cell height Hc along the Y-direction and a cell width Wc along the X-direction. In the illustrated embodiments, the cell height Hc is twice of the active region pitch POD, and the cell width Wc is twice of the gate pitch PG, which is illustrative and not intended for limiting. In some embodiments, the cell height Hc may be about 2 to 30 times of the active region pitch POD, and the cell width Wc may be about 2 to 30 times of the gate pitch PG. In some embodiments, the cell height Hc ranges from about 60 nm to about 180 nm, and the cell width Wc ranges from about 80 nm to about 1800 nm. In some other embodiments, the cell height Hc ranges from about 60 nm to about 500 nm.

Figure 3:
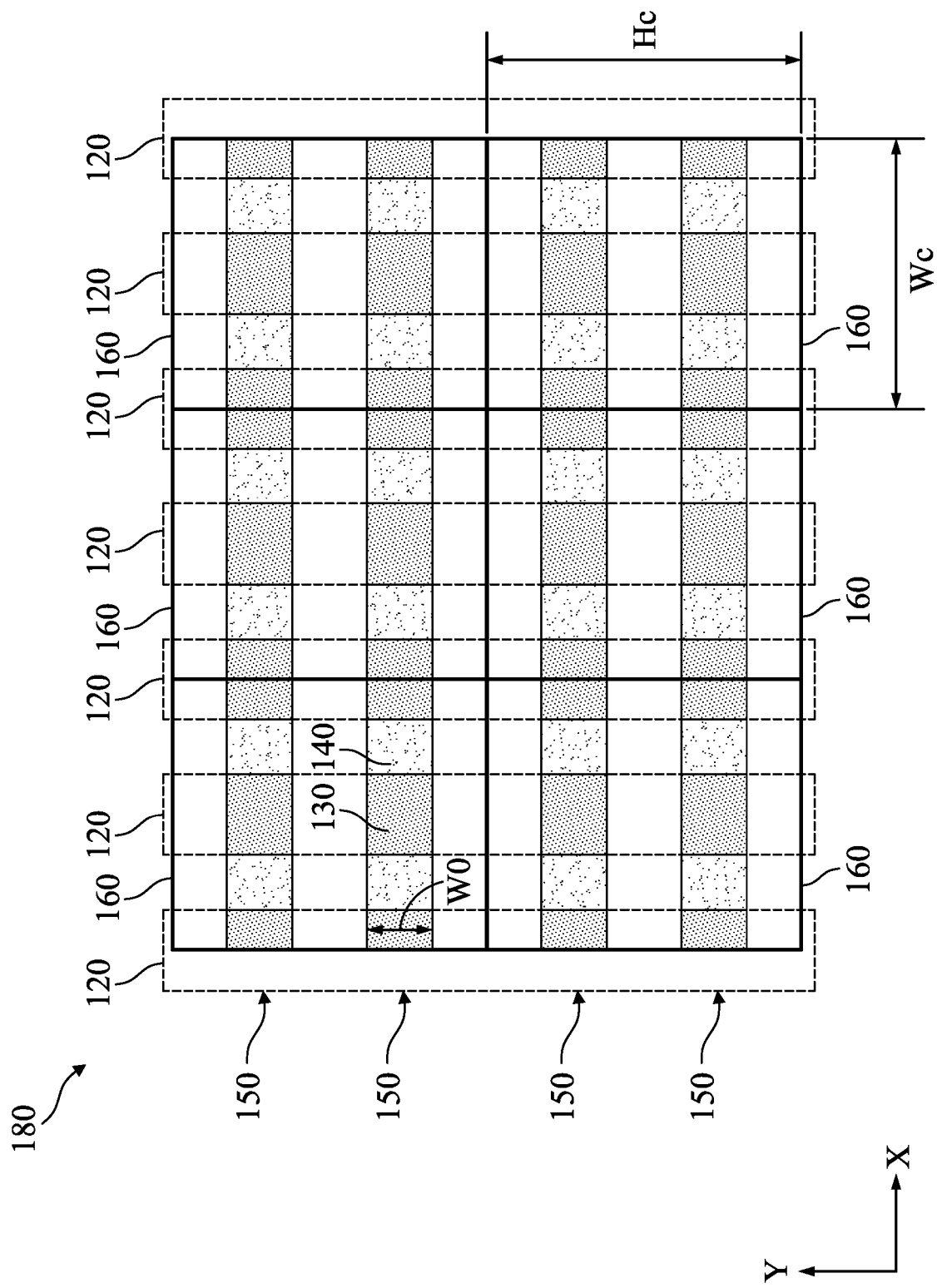
FIGS. 3, 4, 5, and 6 are exemplary layouts using a standard cell in FIG. 2 as a building block, according to one or more aspects of the present disclosure.

FIG. 3 illustrates using the standard cell 160 as a building block or tile to implement a larger layout 180 with many more transistors. In the depicted embodiment, the standard cell 160 is repeated three times along the X-direction and two times along the Y-direction, which is illustrative and not intended for limiting. The gate regions 120 in different standard cells 160 connect with each other along the Y-direction and form a continuous taller gate region 120. The partial gate regions 120 on edges of the standard cells 160 also unite to form an integral gate region 120. The active regions 150 in different standard cells 160 also connect with each other along the X-direction and form a continuous longer active region 150. The width W0 of the longer active region 150 still keeps constant throughout the X-direction. Accordingly, the channel regions 130 (and thus channel members) have the same width W0 everywhere in the layout 180. Since the channel region width is a major factor determining a transistor's power handling capability and channel resistance and in turn device speed, the transistors everywhere in the layout 180 are substantially identical or very similar. Yet, for transistors in different circuits, or transistors in different portions of the same circuit, device performance requirements are different. For example, transistors in high-speed circuits may have requirements for high power handling capability and high device speed, and transistors in input/output (I/O) circuits may have requirements for low power leakage and higher power efficiency. A constant active region width comes along with limited flexibility in achieving transistor performance variation, and the performance-power-area (PPA) criteria is not optimized.

Figure 4:
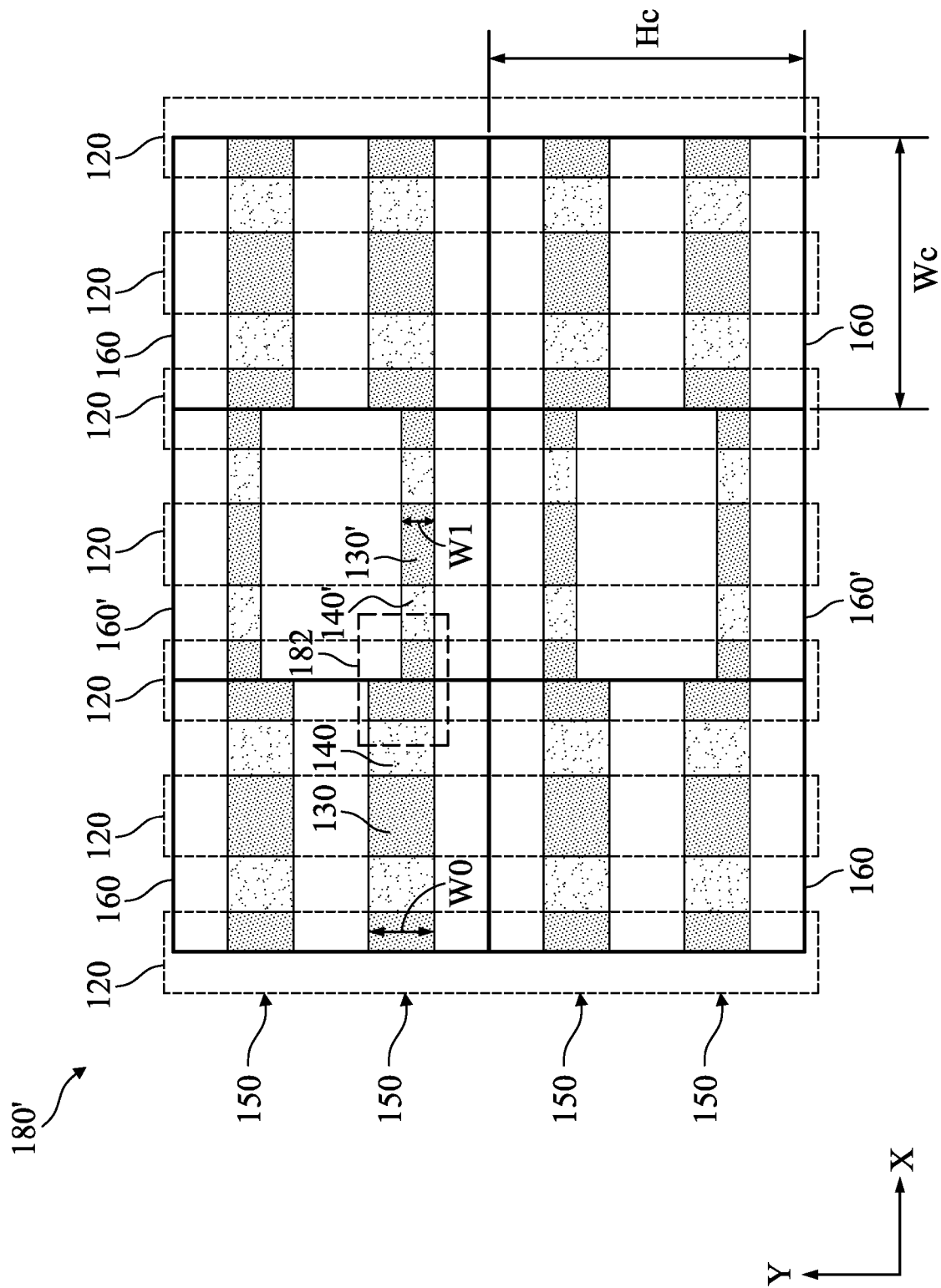

FIG. 4 illustrates an adjusted layout 180' based on a layout adjustment performed on the layout 180 in FIG. 3. The layout adjustment increases (or reduces) the width of the active region 150 in some of the standard cells 160. In the depicted embodiment, the width of the active region 150 in the middle standard cells 160 is reduced, denoted as W1. The standard cells 160 with adjusted active region width is denoted as adjusted cells 160'. Channel regions and S/D regions in the adjusted cells 160' are denoted as channel regions 130' and S/D regions 140', respectively. The distance between adjacent active regions along the Y-direction is also increased in the adjusted cells 160' in the depicted embodiment, spared from the reduced active region width. In some embodiments, a ratio of W1/W0 is from about 30% to about 90%. If the ratio is less than about 40%, the channel region width may become too small and violate certain design rules. If the ratio is larger than about 90%, benefits from the width difference is not obvious and may be outweighed by the risk of overlaying inaccuracy during active region patterning. After the layout adjustment, the active region 150 still continuously extends through the layout 180' but with portions (or segments) with different widths. The transistors formed over the portions with width W0 benefit from less channel resistance along with the larger channel region width and accordingly higher power handling capability, less parasitic capacitance (e.g., STI capacitance), and higher device speed. The transistors formed over the portion with width W1 benefit from less leakage along with the smaller channel region width and accordingly higher power efficiency.

Regarding the transistor formed across the boundary between a standard cell 160 and an adjusted cell 160', such as the transistor highlighted in a dashed box 182, its channel region has a first portion with the width W0 and a second portion with the reduced width W1, and its S/D region locates in the standard cell 160 has the width W0 and the other S/D region locates in the adjusted cell 160' has the reduced width W1. That is, the channel member formed in the region represented by the dashed box 182 has a sheet structure with two portions (segments) of different widths. The transition between the two portions may be a step-profile (e.g., a notch) as shown in FIG. 4, or a tapering sidewall that gradually narrows down between the two portions. Also, the epitaxial S/D features 142 in the standard cell 160 have a larger volume than the ones in the adjusted cell 160'. The performance of this type of transistors may reside between the ones in the standard cell 160 and the ones in the adjusted cell 160' and may be suitable for general applications.

Figure 5:
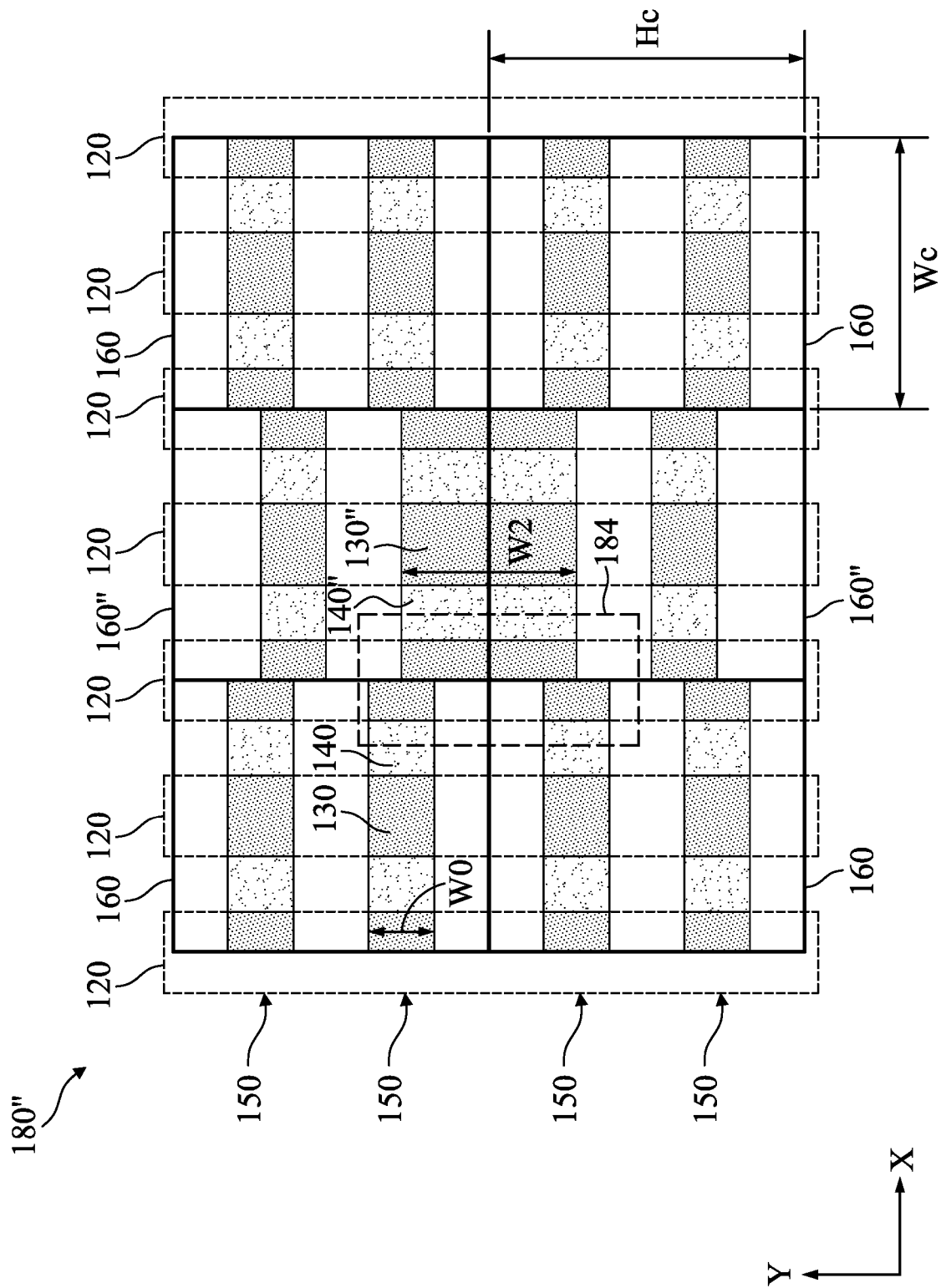

FIG. 5 illustrates another adjusted layout 180" based on a different layout adjustment performed on the layout 180 in FIG. 3. The layout adjustment offsets the active regions 150 in some of the standard cells 160 along the Y-direction, creating adjusted cells 160". Channel regions and S/D regions in the adjusted cells 160" are denoted as channel region 130" and S/D regions 140", respectively. In the depicted embodiment, the active regions in the standard cells 160 and adjusted cells 160" along the X-direction still connects. Further, the two active regions in the center of the adjusted layout 180" connect to each other due to the offset adjustment. The connection unites two active regions otherwise spaced apart in the Y-direction and form one larger X-shape active region. The center portion of the X-shape active region has a width W2, which is about twice of the width W0. The transistors formed over the portions with width W2 benefit from less channel resistance along with the larger channel region width and accordingly higher power handling capability, less parasitic capacitance (e.g., STI capacitance), and higher device speed. The transistors formed over the portion with width W0 benefit from less leakage along with the smaller channel width and accordingly higher power efficiency.

Regarding the transistor formed across the boundary between a standard cell 160 and an adjusted cell 160", such as the transistor highlighted in a dashed box 184, its channel region has two parallel portions with the width W0 and a third portion with the enlarged width W2, and its S/D region locates in the standard cell 160 has two parallel portions with the width W0 and an S/D region locates in the adjusted cell 160" has the enlarged width W2. Also, the channel member formed in the region represented by the dashed box 184 has a sheet structure with two parallel portions (segments) of a smaller width W0 and another portion with an enlarged width W2. The transition between the different portions may be a step-profile (e.g., a notch) as shown in FIG. 5, or a tapering sidewall that gradually narrows down between the different portions. Also, there are two epitaxial S/D features 142 in the standard cell 160 having a smaller volume than the one epitaxial S/D feature 142 in the adjusted cell 160". The performance of this type of transistors may reside between the ones in the standard cell 160 and the ones in the adjusted cell 160" and may be suitable for general applications.

Figure 6:
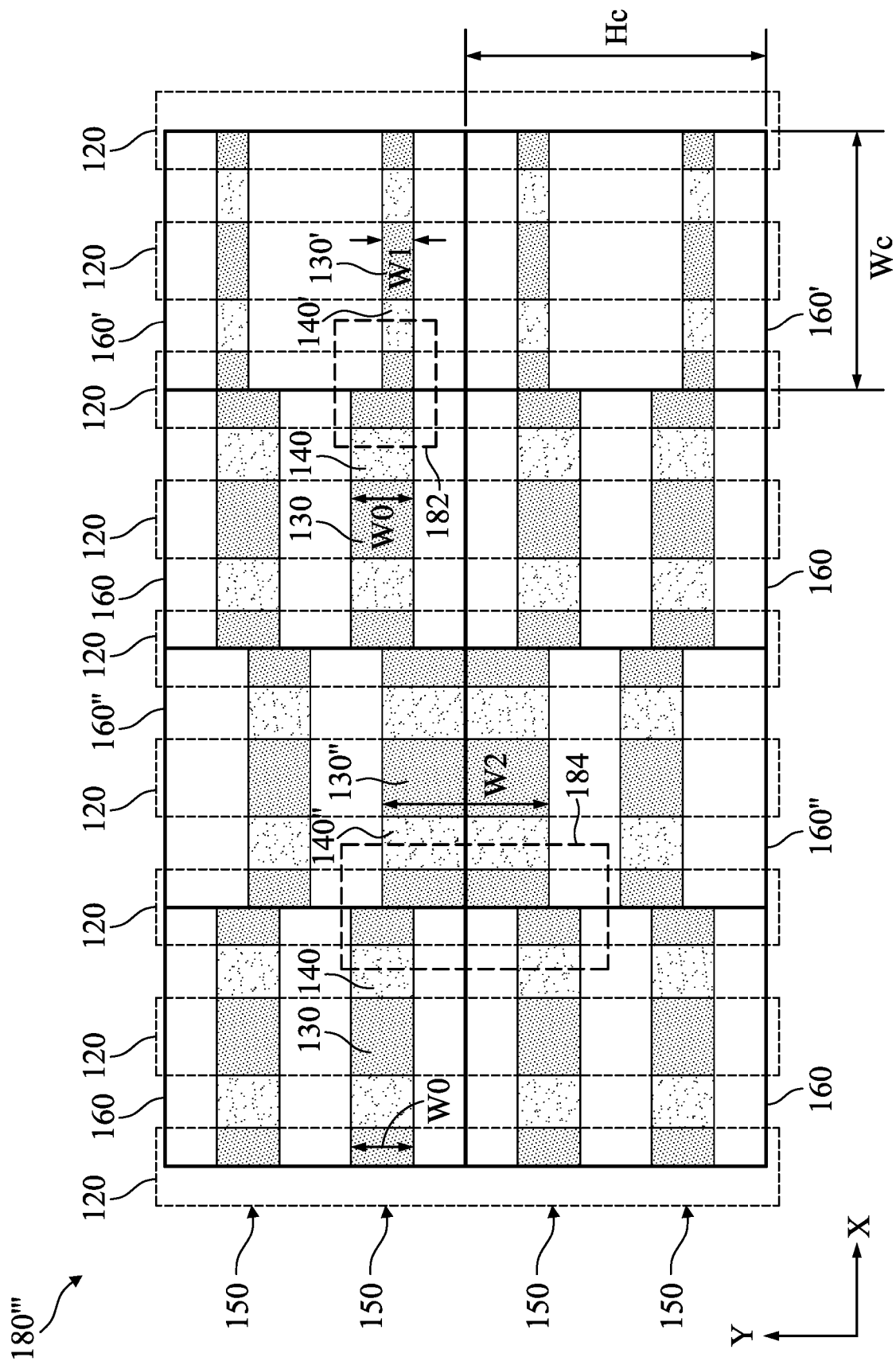

Further, the layout adjustment as shown in FIG. 4 and FIG. 5 can be applied in the same layout to create different adjusted cells 160' and 160". FIG. 6 shows such an example. Reference numerals are repeated in FIG. 6 for ease of understanding, and similar aspects are not repeated in the interest of conciseness. In FIG. 6, by layout adjustments to standard cells 160 to create both adjusted cells 160' and adjusted cells 160", transistors with channel width of W2, W1, W0 (W2>W0>W1), a combination of W0 and W2 (e.g., in region 184), and a combination of W0 and W1 (e.g., in region 182), can be implemented in different regions of the integrated circuit to suite for different circuit application needs.

Figure 7A:
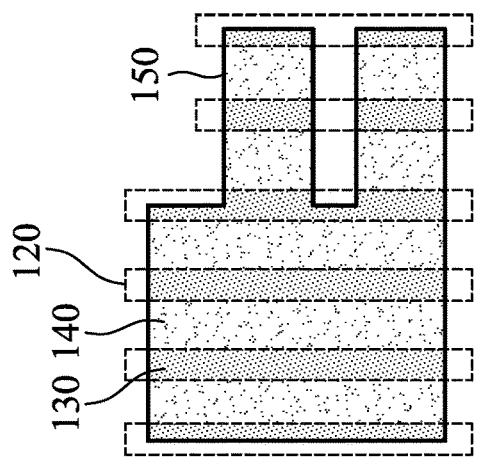
FIGS. 7A, 7B, 7C, 7D, 7E, 7F, 7G, 7H, 7I, 7J and 7K illustrate some embodiments of flexible sheet structure as active regions, according to one or more aspects of the present disclosure.
Figure 7B:
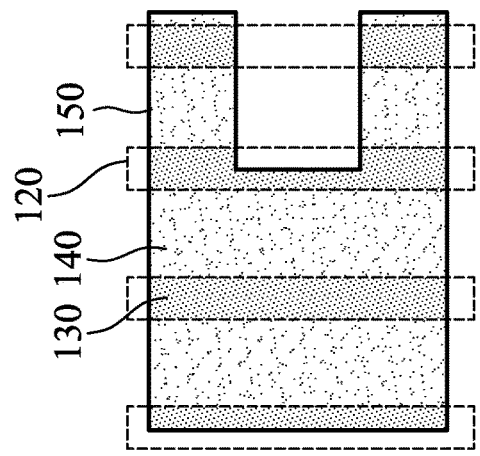
Figure 7C:
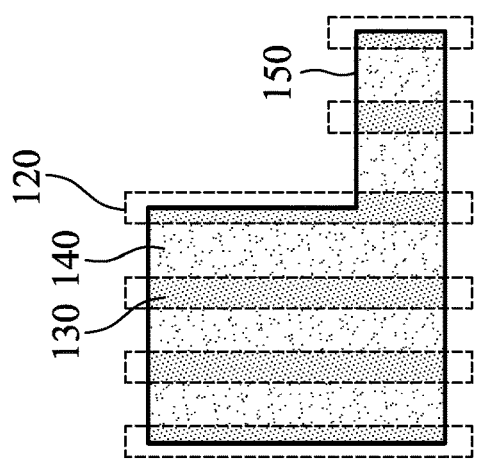
Figure 7D:
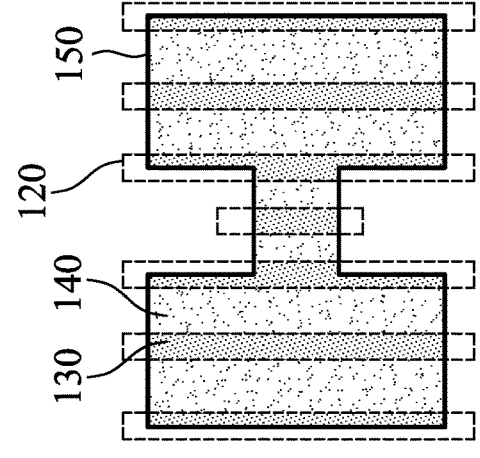
Figure 7E:
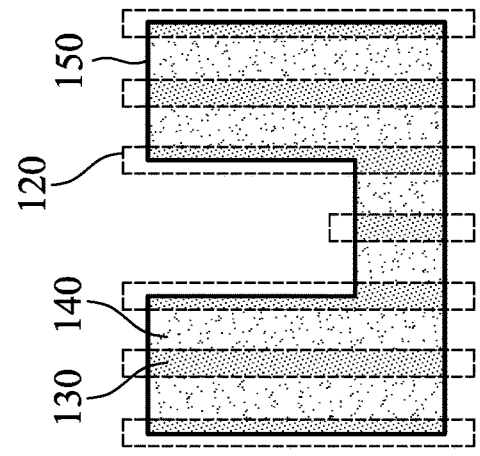
Figure 7F:
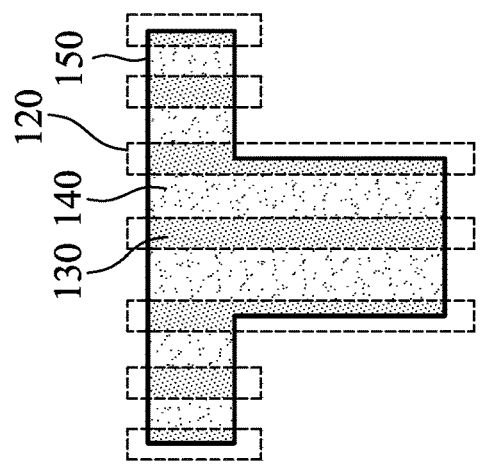
Figure 7G:
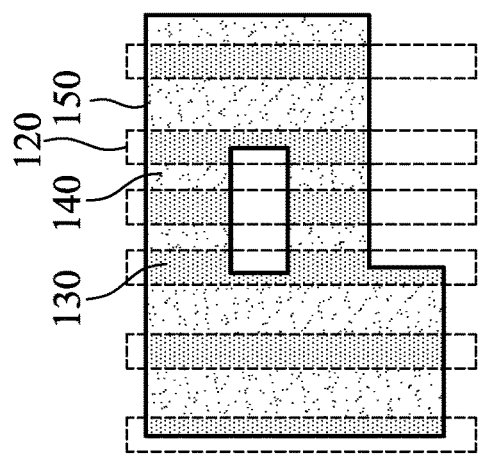
Figure 7H:
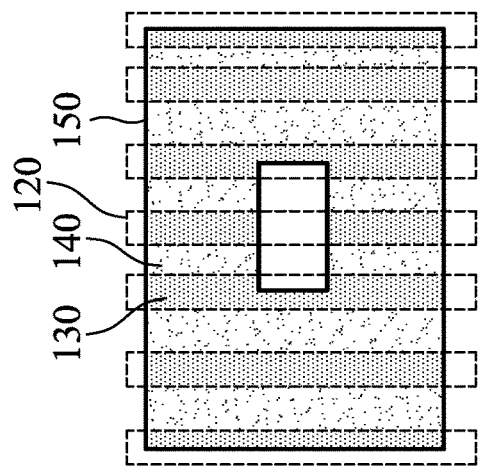
Figure 7I:
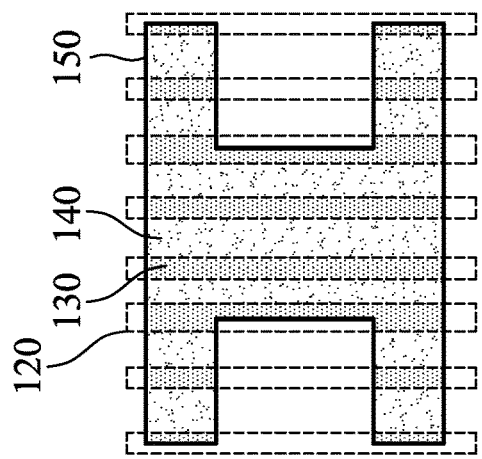
Figure 7J:
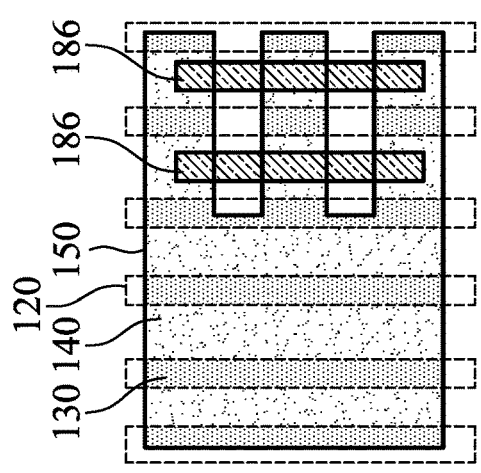
Figure 7K:
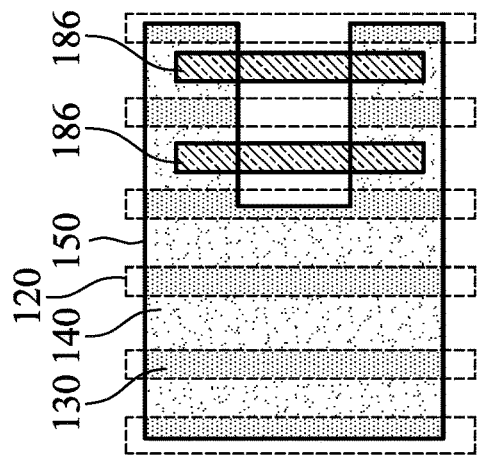

There are numeral other ways to implement layout adjustments. Some embodiments are illustrated in FIGS. 7A-7K. The boundaries of standard cells and adjusted cells are omitted in FIGS. 7A-7K for the sake of simplicity. One difference among FIGS. 7A-7K is the contour of the active region 150. In FIG. 7A, the active region 150 has an L-shape with a first portion of a larger width and a second portion of a smaller width. The gate regions 120 over the second portion may be shorter as well. In FIG. 7B, the active region 150 has a C-shape with a first portion of a larger width and second and third portions of a smaller width. In FIG. 7C, the active region 150 has an F-shape, with a first portion of a larger width and second and third portions of a smaller width. The gate regions 120 over the second and third portions may be shorter as well. In FIG. 7D, the active region 150 has a T-shape with a first portion with a larger width in the middle and second and third portions with a smaller width on both sides. The gate regions 120 over the second and third portions may be shorter as well. In FIG. 7E, the active region 150 has a U-shape with a first portion with a smaller width in the middle and second and third portions with a larger width on both sides. The gate region 120 over the first portion may be shorter as well. In FIG. 7F, the active region 150 has an H-shape with a first portion with a smaller width in the middle and second and third portions with a larger width on both sides. The gate regions 120 over the first portion my be shorter as well. In FIG. 7G, the active region 150 has an X-shape with a first portion with a larger width in the middle and four other narrower portions on four corners. In FIG. 7H, the active region 150 has an O-shape with first and second portions with a larger width on the sides and third and fourth portion with a smaller width in the middle. In FIG. 7I, the active region 150 has a P-shape with a first portion with a larger width on one side, a second portion with a medium width on another side, and third and fourth portions with a smaller width in the middle. The gate regions 120 over the second, third, fourth portions may be shorter as well. In FIG. 7J, the active region 150 has a C-shape with a first portion of a larger width and second and third portions of a smaller width. In FIG. 7K, the active region 150 has an E-shape with a first portion with a larger width and three parallel portions with a smaller width.

Two source/drain contacts 186 are depicted in FIGS. 7J and 7K, respectively, for illustrative purpose and omitted from other figures. Yet those skilled in the art may understand that source/drain contacts also exist in circuits represented by layouts illustrated in FIGS. 2-7J to implement a functional circuit. In one transistor, the source/drain contact 186 electrically couples the S/D regions 140 with smaller width together. The parasitic capacitance between the source/drain contacts 186 and STI structure 108 (FIG. 1) may be a design consideration. The active region 150 in FIG. 7K with an E-shape provides less contact area between the source/drain contacts 186 and the STI structure 108 than the active region 150 in FIG. 7J with a C-shape. Therefore, when the parasitic capacitance between the source/drain contacts and STI structure is a weighted factor, active region with an E-shape may be selected during layout design over a C-shape. Further, the flexible active regions illustrated in FIGS. 7A-7K can serve as building blocks to implement even larger active regions with more complicate contours.

Figure 8:
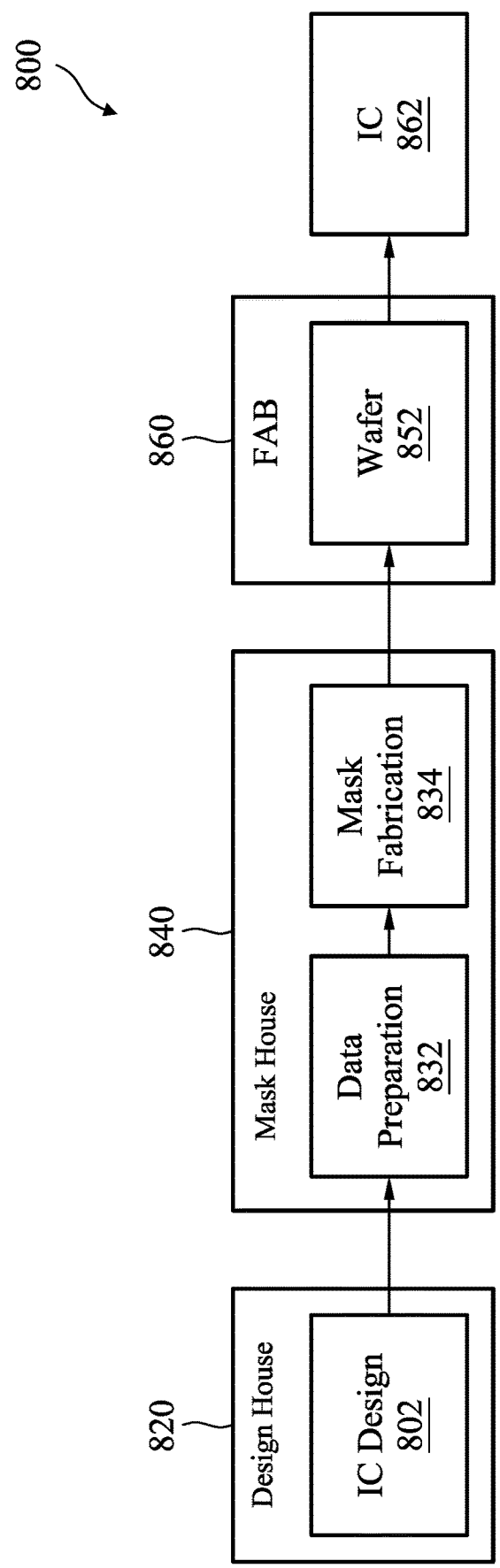
FIG. 8 is a diagram of an integrated circuit manufacturing system, according to one or more aspects of the present disclosure.

An integrated circuit manufacturing flow in an integrated circuit manufacturing system in modifying and/or optimizing sheet structures for active regions is depicted below. FIG. 8 is a simplified block diagram of an embodiment of an integrated circuit manufacturing system 800 and an integrated circuit manufacturing flow associated therewith, which may benefit from various aspects of the provided subject matter. The integrated circuit manufacturing system 800 includes a plurality of entities, such as a design house 820, a mask house 840, and an integrated circuit manufacturer 860 (i.e., a fab), that interact with one another in the design, development, and manufacturing cycles and/or services related to manufacturing an integrated circuit device 862. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 820, mask house 840, and integrated circuit manufacturer 860 may be owned by a single larger company, and may even coexist in a common facility and use common resources.

The design house (or design team) 820 generates an IC design layout 802. The integrated circuit design layout 802 includes various geometrical patterns designed for the integrated circuit device 862. The various geometrical patterns in the IC design layout 802, such as rectangles, may correspond to patterns of active regions and gate regions to be fabricated. The design house 820 implements a proper design procedure to form the integrated circuit design layout 802. The design procedure may include logic design, physical design, and/or place and route. The integrated circuit design layout 802 is presented in one or more data files having information of the geometrical patterns. For example, the integrated circuit design layout 802 can be expressed in a GDSII file format, a DFII file format, or another suitable computer-readable data format.

The mask house 840 uses the design layout 802 to manufacture one or more masks to be used for fabricating various layers of the integrated circuit device 862, particularly a layout of a flexible sheet structure for active regions. The mask house 840 performs mask data preparation 832, mask fabrication 834, and other suitable tasks. The mask data preparation 832 turns the sheet structure layout with standard cells into flexible sheet structure layout, and also translates the layout into a form that can be physically written by a mask writer. The mask fabrication 834 then fabricates a plurality of masks that are used for patterning a substrate (e.g., a wafer). In the present embodiment, the mask data preparation 832 and mask fabrication 834 are illustrated as separate elements. However, the mask data preparation 832 and mask fabrication 834 can be collectively referred to as mask data preparation.

In the present embodiment, the mask data preparation 832 includes layout optimization and simulation to adjust sheet structures for active regions, which will be described in details later. The mask data preparation 832 may further include optical proximity correction (OPC) which uses lithography enhancement techniques to compensate for image errors, such as those that can arise from diffraction, interference, or other process effects. The mask data preparation 832 may further include a mask rule checker (MRC) that checks the integrated circuit design layout with a set of mask creation rules which may contain certain geometric and connectivity restrictions to ensure sufficient margins, to account for variability in semiconductor manufacturing processes, etc. The mask data preparation 832 may further include lithography process checking (LPC) that simulates processing that will be implemented by the integrated circuit manufacturer 860 to fabricate wafers 852 and further diced into integrated circuit device 862. The processing parameters may include parameters associated with various processes of the integrated circuit manufacturing cycle, parameters associated with tools used for manufacturing the integrated circuit, and/or other aspects of the manufacturing process.

It should be understood that the above description of the mask data preparation 832 has been simplified for the purposes of clarity, and data preparation may include additional features such as a logic operation (LOP) to modify the integrated circuit design layout according to manufacturing rules, particularly a hybrid bonding layer design rule. Additionally, the processes applied to the integrated circuit design layout 802 during mask data preparation 832 may be executed in a variety of different orders.

After mask data preparation 832 and during mask fabrication 834, a mask or a group of masks are fabricated based on the modified (flexible) sheet structure design layout. For example, an electron-beam (e-beam) or a mechanism of multiple e-beams is used to form a pattern on a mask (photomask or reticle) based on the modified layout. The mask can be formed in various technologies such as a transmissive mask or a reflective mask. In an embodiment, the mask is formed using binary technology, where a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

The integrated circuit manufacturer 860, such as a semiconductor foundry, uses the mask (or masks) fabricated by the mask house 840 to fabricate the integrated circuit device 862. The integrated circuit manufacturer 860 is an integrated circuit fabrication business that can include a myriad of manufacturing facilities for the fabrication of a variety of different integrated circuit products. For example, there may be a manufacturing facility for the front-end fabrication of a plurality of integrated circuit products (i.e., front-end-of-line (FEOL) fabrication), while a second manufacturing facility may provide the back-end fabrication for the interconnection and packaging of the integrated circuit products (i.e., back-end-of-line (BEOL) fabrication), and a third manufacturing facility may provide other services for the foundry business.

Figure 9:
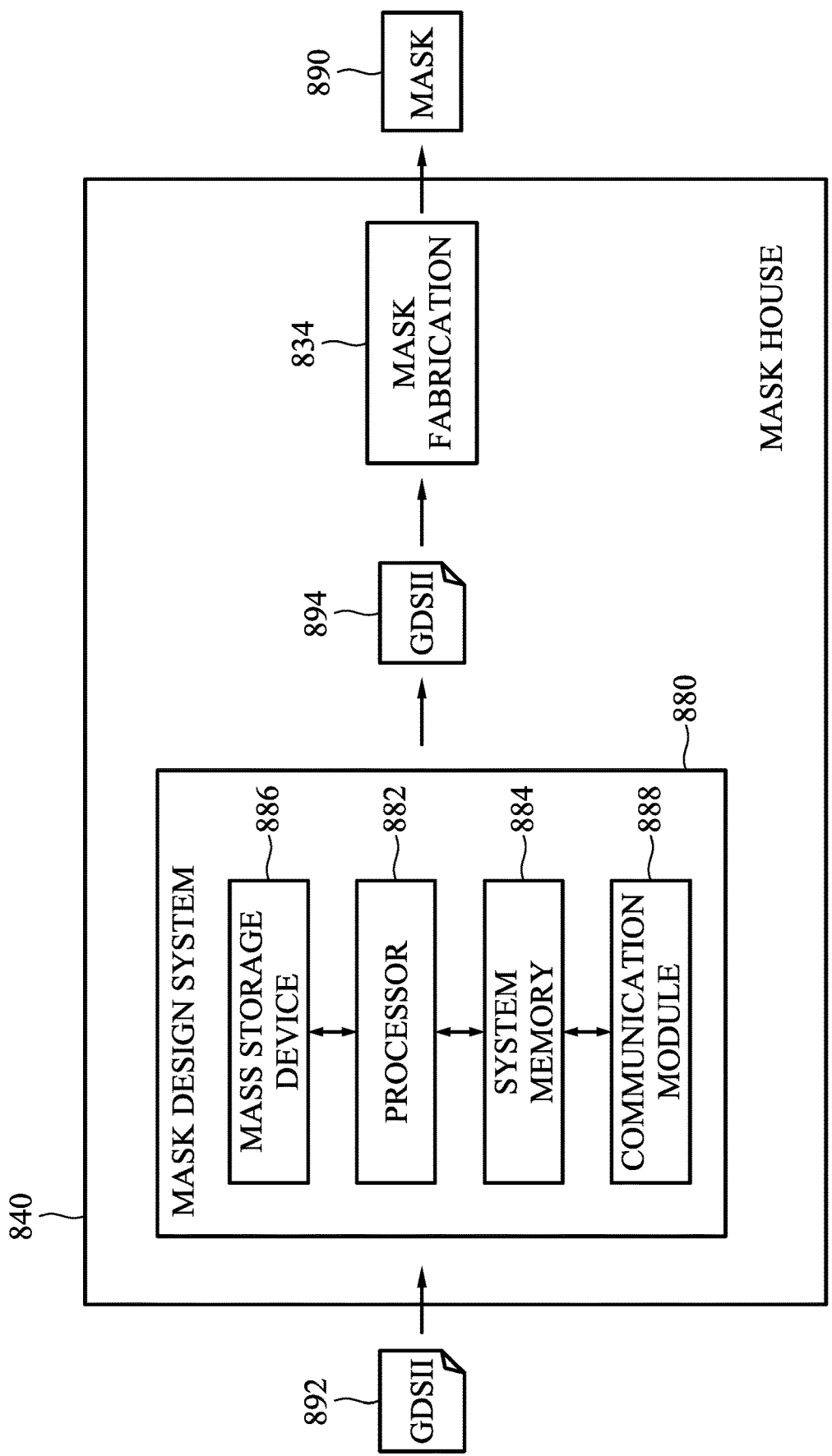
FIG. 9 is a diagram of a mask house as shown in FIG. 8, according to one or more aspects of the present disclosure.

FIG. 9 is a more detailed block diagram of the mask house 840 shown in FIG. 8 according to various aspects of the present disclosure. In the illustrated embodiment, the mask house 840 includes a mask design system 880 that is tailored to perform the functionality described in association with mask data preparation 832 of FIG. 8. The mask design system 880 is an information handling system such as a computer, server, workstation, or other suitable device. The mask design system 880 includes a processor 882 that is communicatively coupled to a system memory 884, a mass storage device 886, and a communication module 888. The system memory 884 provides the processor 882 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 886. Examples of mass storage devices may include hard drives, optical drives, magneto-optical drives, solid-state storage devices, and/or a variety of other mass storage devices known in the art. The communication module 888 is operable to communicate information such as integrated circuit design layout files with the other components in the integrated circuit manufacturing system 800, such as the design house 820. Examples of communication modules may include Ethernet cards, 802.11 WiFi devices, cellular data radios, and/or other suitable devices.

In operation, the mask design system 880 is configured to manipulate the standard cell design layout before it is transferred to a mask 890 by the mask fabrication 834. In an embodiment, the mask data preparation 832 is implemented as software instructions executing on the mask design system 880. To further this embodiment, the mask design system 880 receives a first GDSII file 892 containing the standard cell design layout from the design house 820, and modifies the standard cell design layout, for example, to adjust widths of active regions or offset locations of active regions in some standard cells. After the mask data preparation 832 is complete, the mask design system 880 transmits a second GDSII file 894 containing a modified design layout to the mask fabrication 834. In alternative embodiments, the integrated design layout may be transmitted between the components in integrated circuit manufacturing system 800 in alternate file formats such as DFII, CIF, OASIS, or any other suitable file type. Further, the mask design system 880 and the mask house 840 may include additional and/or different components in alternative embodiments.

Figure 10:
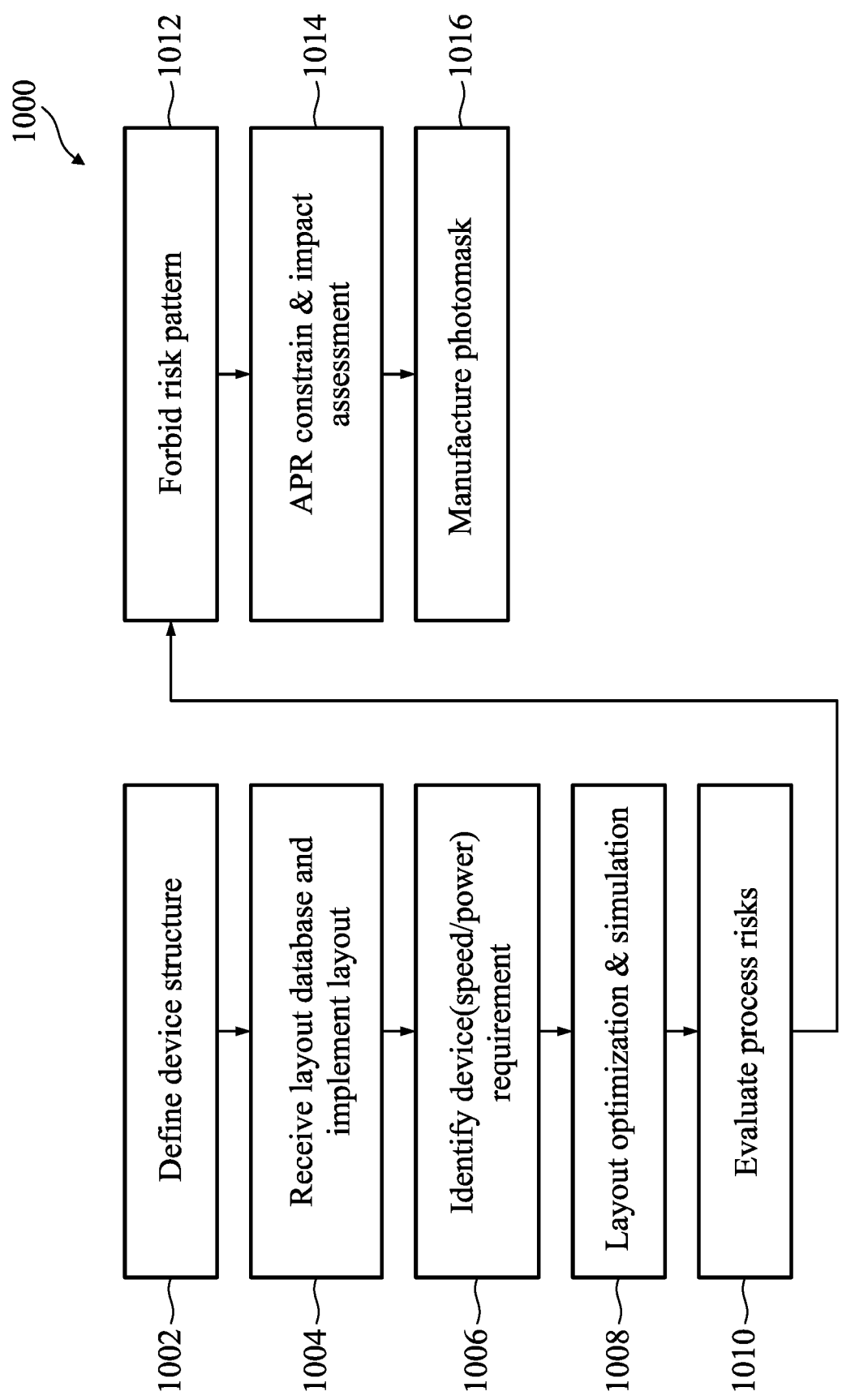
FIG. 10 illustrate a flow chart of a method for modifying layouts to provide a flexible sheet structure for active regions of a semiconductor device, according to one or more aspects of the present disclosure.

FIG. 10 is a flowchart of a method 1000 of modifying sheet structures for active regions and generating associated photomask for manufacturing, according to various aspects of the present disclosure. The method 1000 may be performed at the mask house 840 as depicted in FIGS. 8 and 9. The method 1000 includes operations at blocks 1002, 1004, 1008, 1010, 1012, 1014, and 1016. The operations at block 1002 receives a defined device structure, such as a schematic representing a circuit design. The operations at block 1004 receives layout database, such as standard cell definition, and implement layout based on the defined device structure. The operations at block 1006 identify device requirements, such as transistors for high-speed applications and transistors for low-power applications. The operations at block 1008 modifies the layout to adjust some of the standard cells to implement flexible sheet structures for active regions. The operations at block 1008 also runs performance-power-area (PPA) simulations to optimize PPA benefits based on tweaking the standard cells. The operations at block 1010 evaluates process risks. For example, if width of some portions of the active region becomes too small, it would be flagged to avoid line broken during manufacturing. The operations at block 1012 forbids risk patterns from the layout adjustment and regenerates a modified layout. The operations at block 1014 performs Automatic Placement and Routing (APR) constrain and impact assessment. If the assessment fails, the method 1000 may loop back to operations at block 1008 to readjust the layout until the assessment at block 1014 is successful. If the assessment successfully completes, the operation 1016 manufactures the corresponding photomask for forming flexible sheet structures for active regions.

Figure 11:
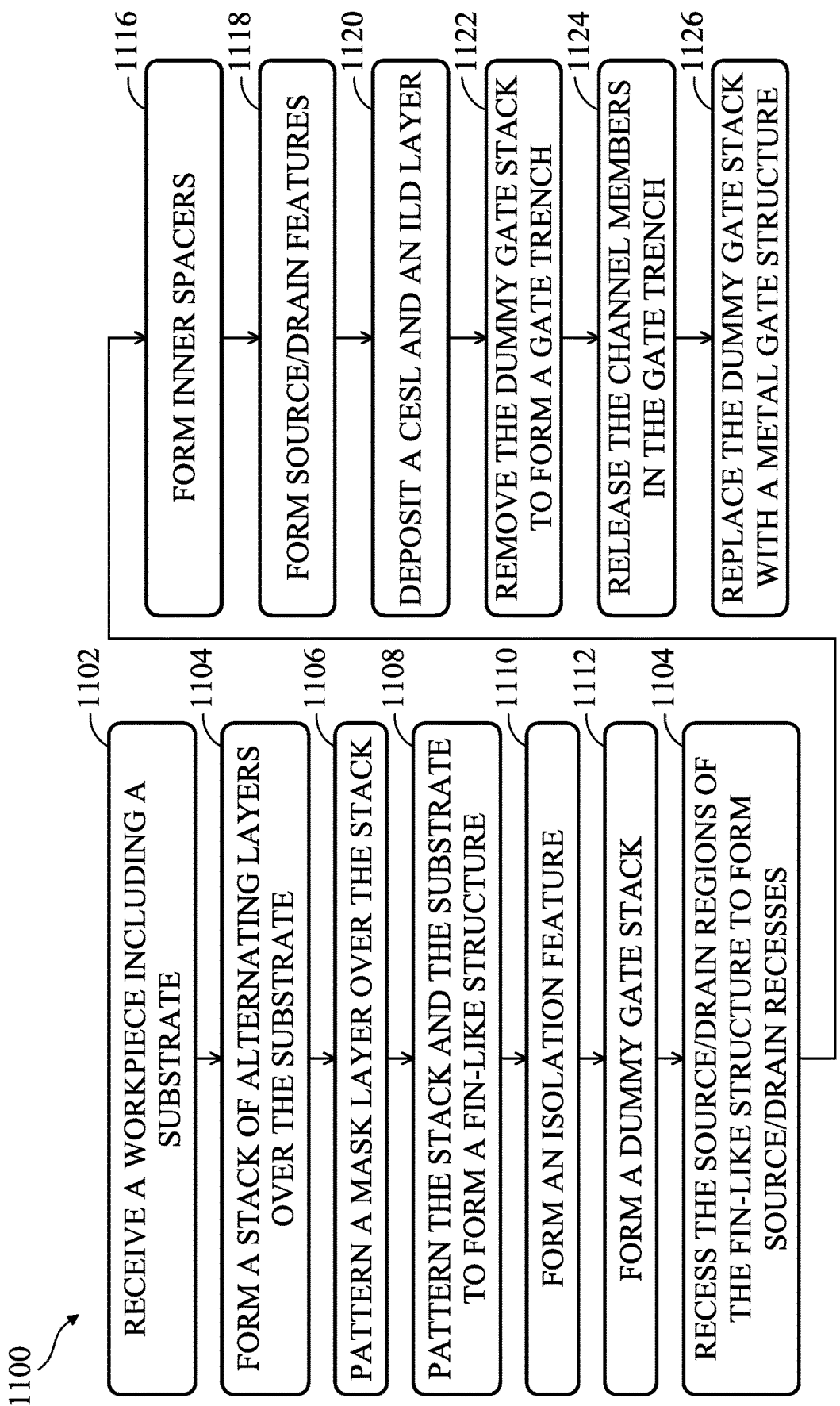
FIG. 11 illustrate a flow chart of a method for forming a semiconductor device with a flexible sheet structure, according to one or more aspects of the present disclosure.

FIG. 11 is a flowchart of a method 1100 of forming a semiconductor device. The method 1100 may be performed at the integrated circuit manufacturer 860 as depicted in FIG. 8. The method 1100 is merely an example and is not intended to limit the present disclosure to what is explicitly illustrated in the method 1100. Additional steps may be provided before, during and after the method 1100, and some steps described can be replaced, eliminated, or moved around for additional embodiments of the method. Not all steps are described herein in detail for reasons of simplicity. The method 1100 is described below in conjunction with FIGS. 12-24B, which illustrate perspective and cross-sectional views of a workpiece 200 (or device 200) at different stages of fabrication according to embodiments of the method 1100. Embodiments of the present disclosure are described in forming an MBC transistor with an X-shape active region as in FIG. 7G, which is for illustration purpose only and should not be construed as limiting the scope of the present disclosure; for example, the present disclosure may also be applicable to forming active regions with other shapes, including the ones illustrated in FIGS. 7A-7K.

Figure 12:
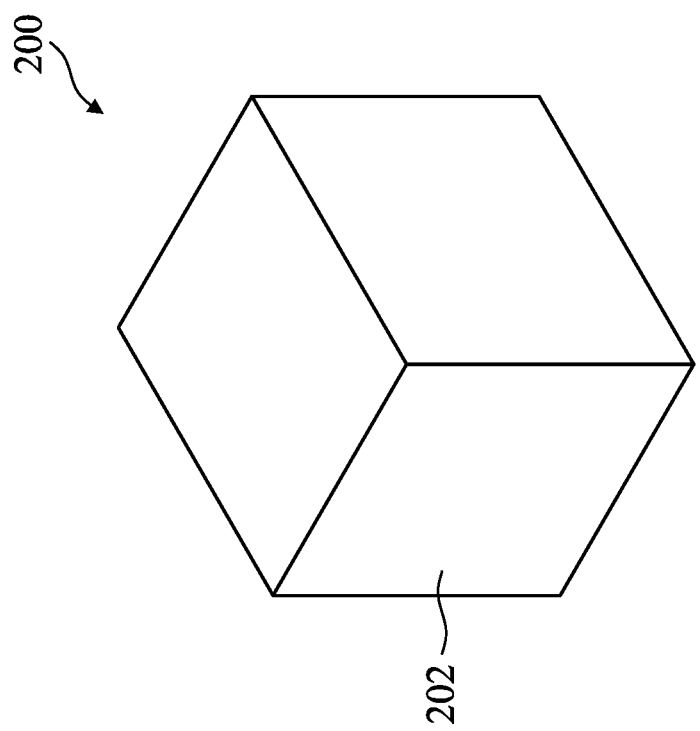
FIGS. 12, 13, 14, 15, 16, 17, 18, 19, 20, 21, and 22 illustrate perspective views of a workpiece during a fabrication process according to the method of FIG. 11, according to one or more aspects of the present disclosure.
Figure 12:
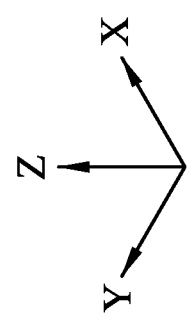

Referring to FIGS. 11 and 12, the method 1100 includes a block 1102 where a workpiece 200 is received. The workpiece 200 includes a substrate 202. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various layers, including conductive or insulating layers formed on a semiconductor substrate.

Figure 13:
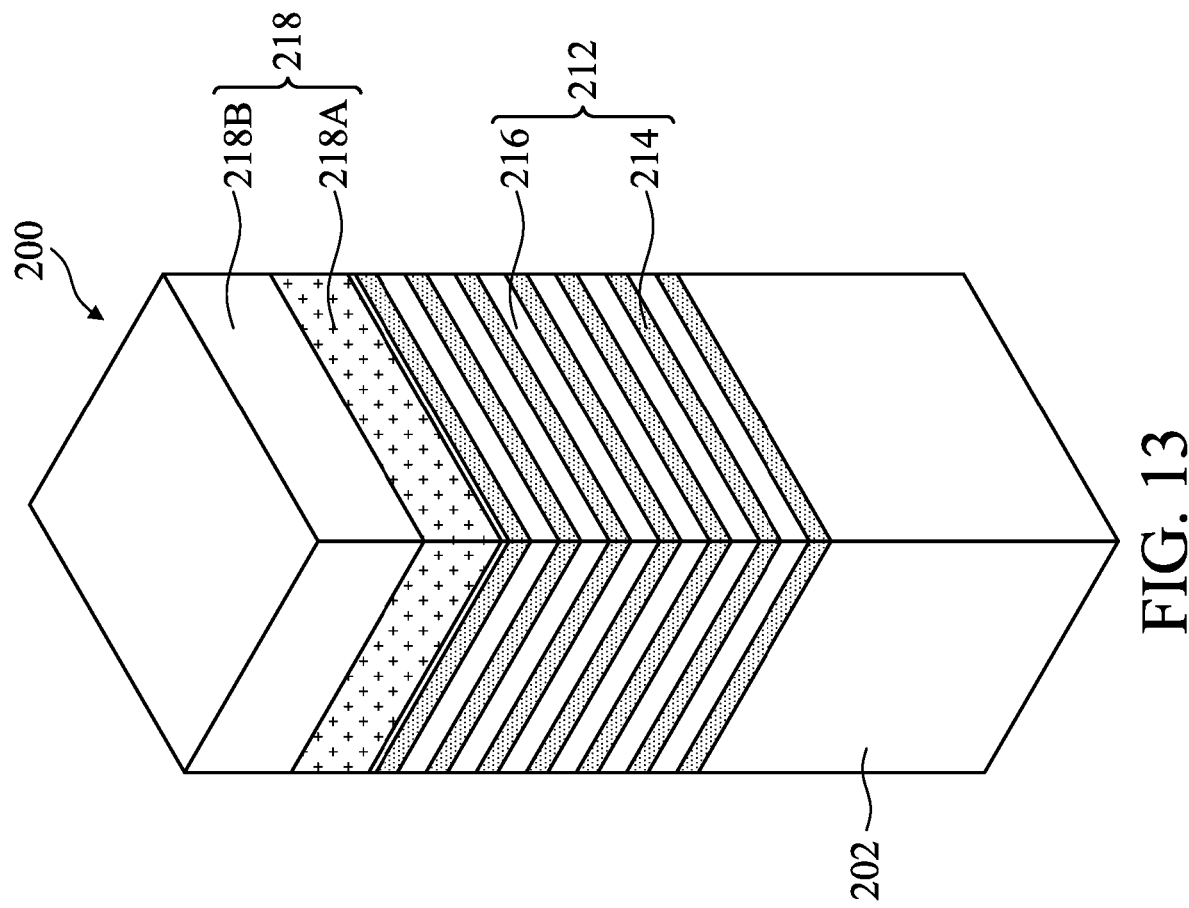

Referring to FIGS. 11 and 13, the method 1100 includes a block 1104 where one or more epitaxial layers are formed over the substrate 202. In some embodiments, an epitaxial stack 212 is formed over the substrate 202. The epitaxial stack 212 includes epitaxial layers 214 of a first composition interposed by epitaxial layers 216 of a second composition. The first and second compositions can be different. In an embodiment, the epitaxial layers 214 are silicon germanium (SiGe) and the epitaxial layers 216 are silicon (Si). However, other embodiments are possible including those that provide for a first composition and a second composition having different oxidation rates and/or etch selectivity. The numbers of the epitaxial layers 214 and 216 as illustrated in FIG. 13 are for illustrative purposes only and not intended to be limiting beyond what is specifically recited in the claims. It can be appreciated that any number of epitaxial layers can be formed in the epitaxial stack 212; the number of epitaxial layers depending on the desired number of channel layers for forming transistors. In some embodiments, the numbers of epitaxial layers 214 and 216 are between 2 and 10, respectively.

In some embodiments, the epitaxial layer 214 has a thickness ranging from about 8 nm to about 12 nm. The epitaxial layers 214 may be substantially uniform in thickness. In some embodiments, the epitaxial layer 216 has a thickness ranging from about 8 nm to about 10 nm. In some embodiments, the epitaxial layers 216 may be substantially uniform in thickness. As described in more detail below, the epitaxial layers 216 may serve as channel members (or channel layers) for subsequently-formed MBC transistors and its thickness is chosen based on device performance considerations. The epitaxial layers 214 may serve to reserve a spacing (or referred to as a gap) between adjacent channel layers and its thickness is chosen based on device performance considerations. The epitaxial layers 214 would be subsequently removed and may also be referred to as the sacrificial layers 214.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the epitaxial layers 216, include the same material as the substrate 202, such as silicon (Si). In some embodiments, the epitaxial layers 214 and 216 include a different material than the substrate 202. As stated above, in at least some examples, the epitaxial layer 214 includes an epitaxially grown $Si_{1-x}Ge_x$ layer (e.g., x is about 25~55%) and the epitaxial layer 216 includes an epitaxially grown Si layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation and etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Further, a mask layer 218 is formed over the epitaxial stack 212. In some embodiments, the mask layer 218 includes a first mask layer 218A and a second mask layer 218B. The first mask layer 218A is a pad oxide layer made of silicon oxide, which can be formed by a thermal oxidation process. The second mask layer 218B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Figure 14:
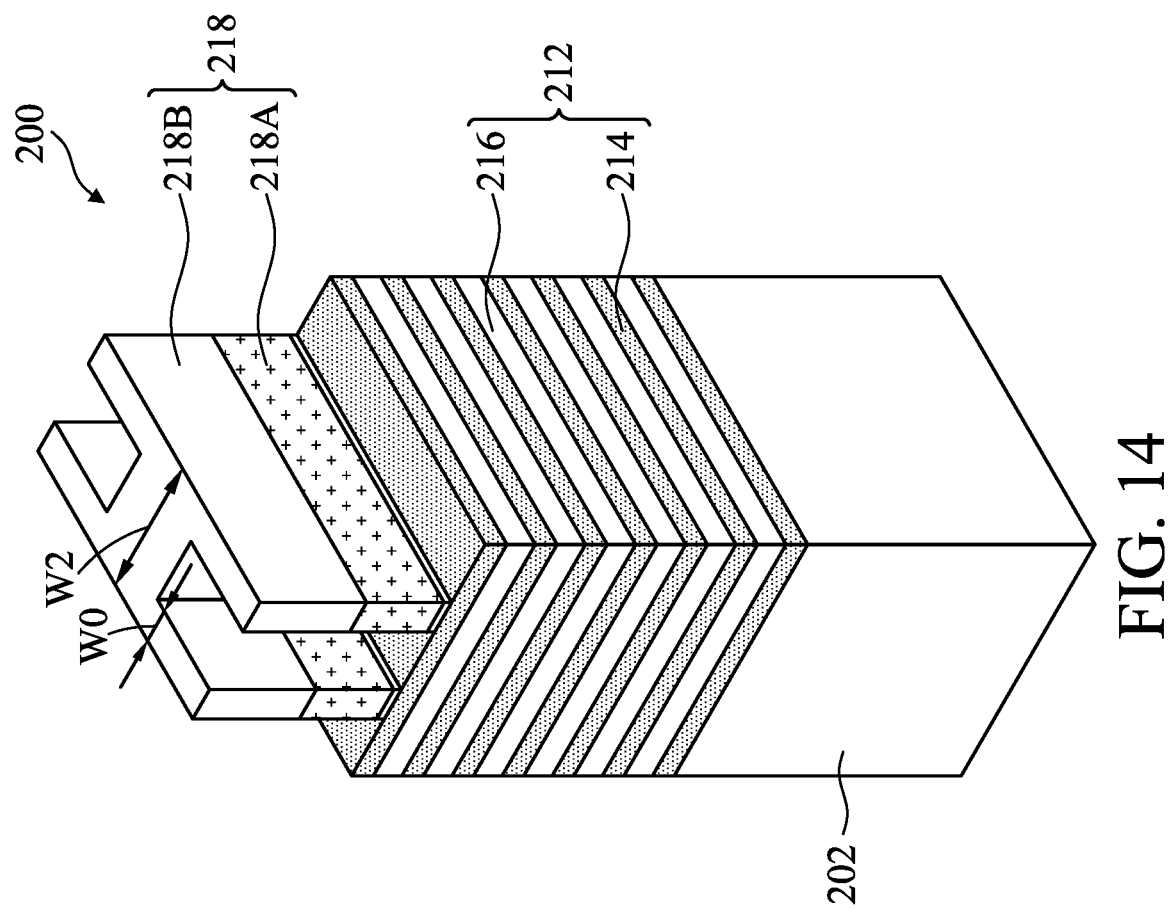

Referring to FIGS. 11 and 14, the method 1100 includes a block 1106 where the mask layer 218 is patterned to form an X-shape by using one of the photomasks manufactured by the method 1000 as depicted in FIG. 10. In some embodiments, the mask layer 218 is patterned using any suitable methods such as a photolithography process, which may include forming a resist layer on the mask layer 218, exposing the resist by a lithography exposure process, performing a post-exposure bake process, developing the photoresist layer to form the patterned photoresist layer that exposes part of the mask layer 218, patterning the mask layer 218, and finally removing the patterned resist layer. The lithography process may be alternatively replaced by other suitable techniques, such as e-beam writing, ion-beam writing, maskless patterning or molecular printing. As depicted in FIG. 14, the mask layer 218 has an X-shape with a middle portion having a larger width W2 (measured along the Y-direction) and four corner portions having a smaller width W0.

Figure 15:
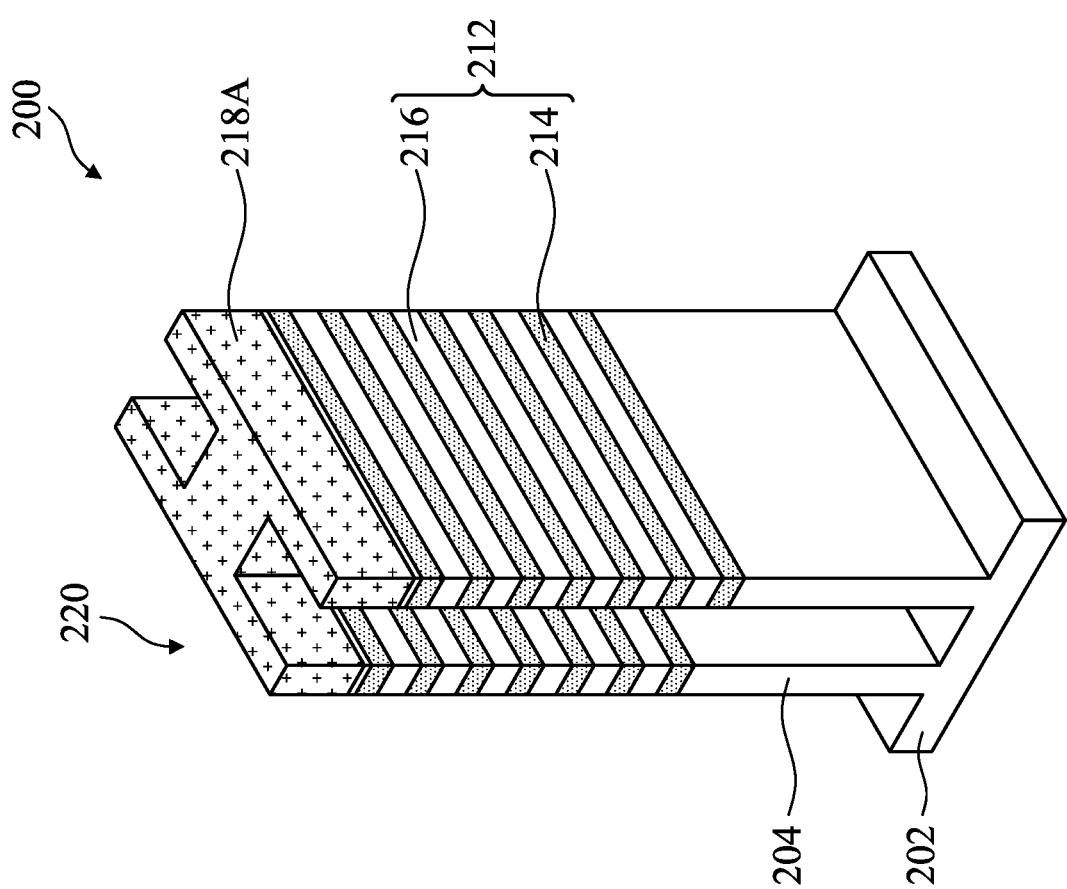

Referring to FIGS. 11 and 15, the method 1100 includes a block 1108 where a top portion of the substrate 202 is patterned to form a fin structure (also referred to as fin base) 204 and the stack 212 is patterned to form a fin-shaped structure 220 above the fin base 204. To pattern the stack 212, the patterned mask layer 218 may be used as an etch mask to etch the stack 212 through openings in the etch mask to form the fin-shaped structure 220. The etching process can include dry etching, wet etching, reactive ion etching (RIE), and/or other suitable processes. The second mask layer 218B may be removed during the etching process, while the first mask layer 218A may still remain over the fin-shaped structure 220.

Figure 16:
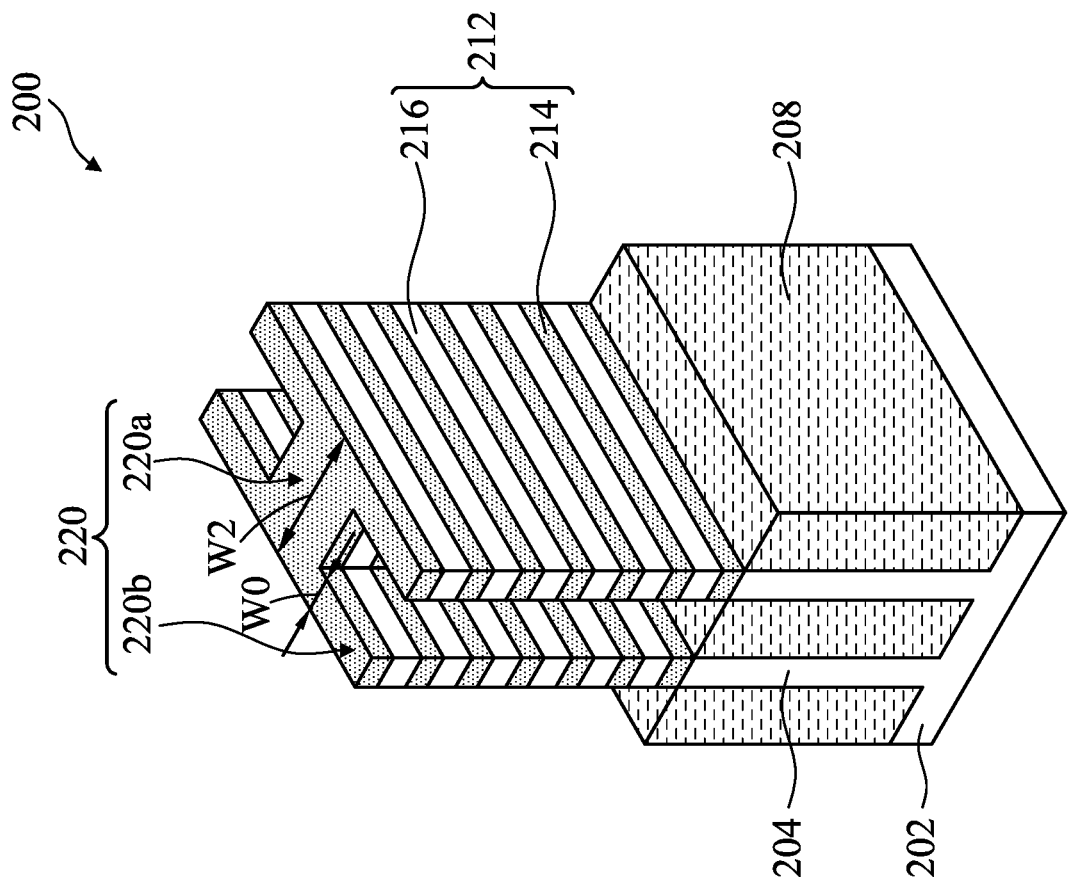

Referring to FIGS. 11 and 16, the method 1100 includes a block 1110 where an isolation feature 208 is formed. The isolation feature 208 may be referred to as a shallow trench isolation (STI) feature 208. In an example process to form the isolation feature 208, a dielectric material is deposited over the workpiece 200, filling the fin trenches with the dielectric material. In some embodiments, the dielectric material may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In various examples, at block 1110, the dielectric material may be deposited by flowable CVD (FCVD), spin-on coating, and/or other suitable process. The deposited dielectric material is then thinned and planarized, for example by a chemical mechanical polishing (CMP) process, until the first mask layer 218A is exposed. After the planarization, the deposited dielectric material is recessed in an etching-back process until the fin-shaped structures 220, particularly the sacrificial layers 214 and the channel layers 216, rise above the isolation feature 208. The first mask layer 218A may also be removed in the etching-back process. At this point, the fin base 204 is surrounded by the isolation feature 208. The fin-like structure 220 rises above the isolation feature 208. As depicted in FIG. 16, the fin-like structure 220 has an X-shape with a middle portion 220a having a larger width W2 (measured along the Y-direction) and four corner portions 220b having a smaller width W0.

Figure 17:
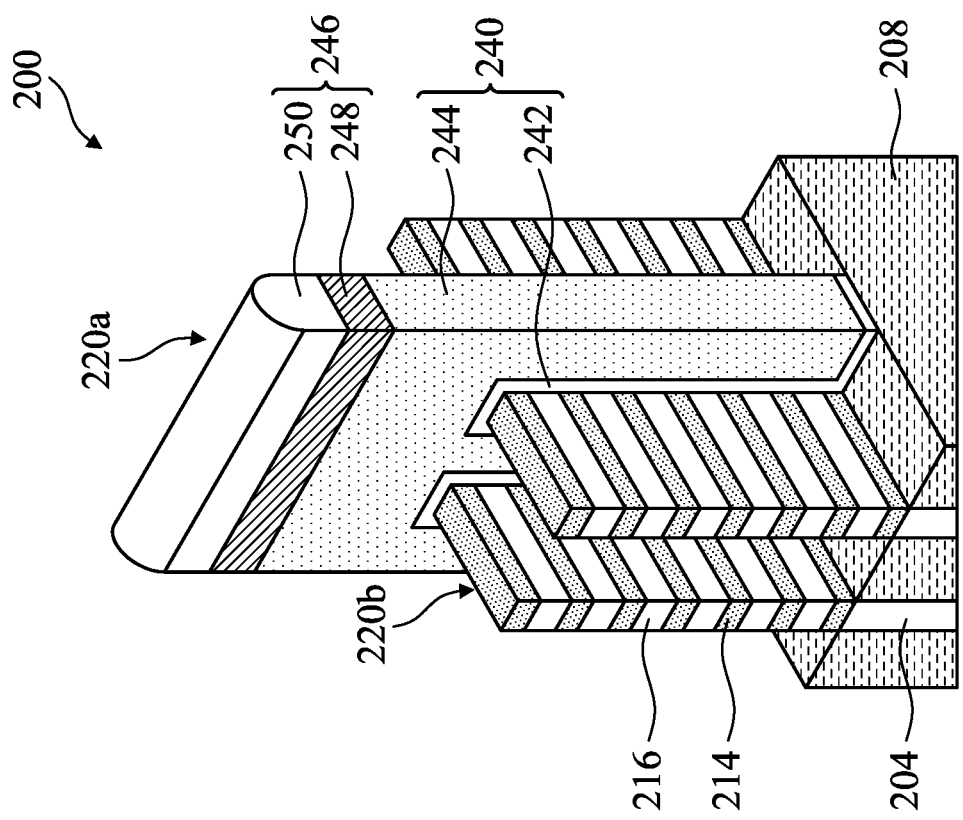

Referring to FIGS. 11 and 17, the method 1100 includes a block 1112 where dummy gate stacks 240 are formed over the channel regions of the fin-like structure 220. In some embodiments, a gate replacement process (or gate-last process) is adopted where the dummy gate stacks 240 serve as a placeholder for functional gate structures. Other processes and configuration are possible. Although in FIG. 7G, eight gate regions 120 are illustrated, only one dummy gate stack 240 formed in one gate region is illustrated in FIG. 17 for the sake of simplicity. The dummy gate stack 240 is directly above the boundary between the middle portion 220a and the corner portions 220b of the fin-like structure 220. Yet those skilled in the art may understand that there may be other dummy gate stacks 240 formed directly above the middle portion 220a and other dummy gate stacks 240 formed directly above the corner portions 220b, as shown in FIG. 7G.

In the illustrated embodiment, the dummy gate stack 240 includes a dummy dielectric layer 242 and a dummy electrode 244 disposed over the dummy dielectric layer 242. For patterning purposes, a gate top hard mask 246 is deposited over the dummy gate stacks 240. The gate top hard mask 246 may be a multi-layer and include a silicon nitride mask layer 248 and a silicon oxide mask layer 250 over the silicon nitride mask layer 248. The regions of the fin-like structure 220 underlying the dummy gate stack 240 may be referred to as the channel region. The channel region in the fin-like structure 220 is sandwiched between two source/drain regions for source/drain formation. In an example process, the dummy dielectric layer 242 is blanketly deposited over the workpiece 200 by CVD. A material layer for the dummy electrode 244 is then deposited over the dummy dielectric layer 242. The dummy dielectric layer 242 and the material layer for the dummy electrode 244 are then patterned using photolithography processes to form the dummy gate stack 240. In some embodiments, the dummy dielectric layer 242 may include silicon oxide and the dummy electrode 244 may include polycrystalline silicon (polysilicon).

Figure 18:
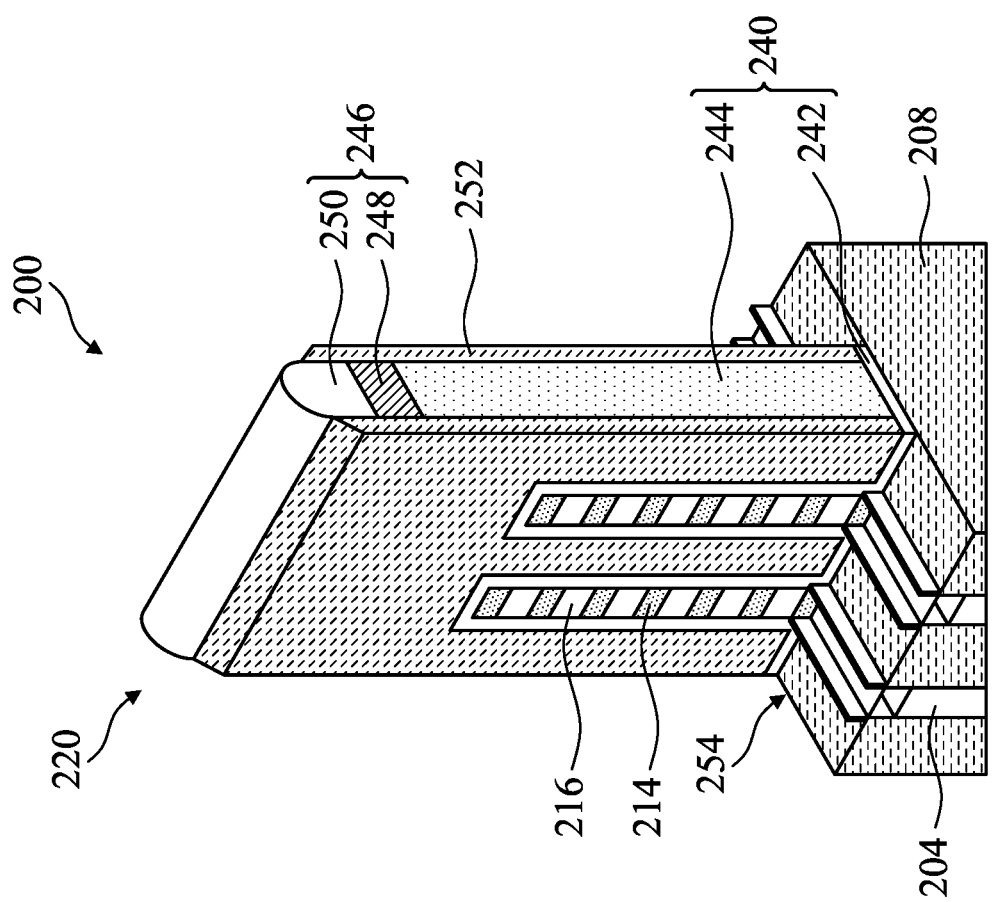

Referring to FIGS. 11 and 18, the method 1100 includes a block 1114 where the source/drain regions of the fin-shaped structures 220 are recessed to form source recesses and drain recesses, collectively as source/drain recesses 254 (or source/drain trenches 254). The method 1100 may first form gate spacers 252 on sidewalls of the dummy gate stack 240. With the dummy gate stack 240 and the gate spacers 252 serving as an etch mask, the workpiece 200 is anisotropically etched to form the source/drain recesses 254 over the source/drain regions of the fin-like structure 220. The anisotropic etch may include a dry etching process. For example, the dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 19:
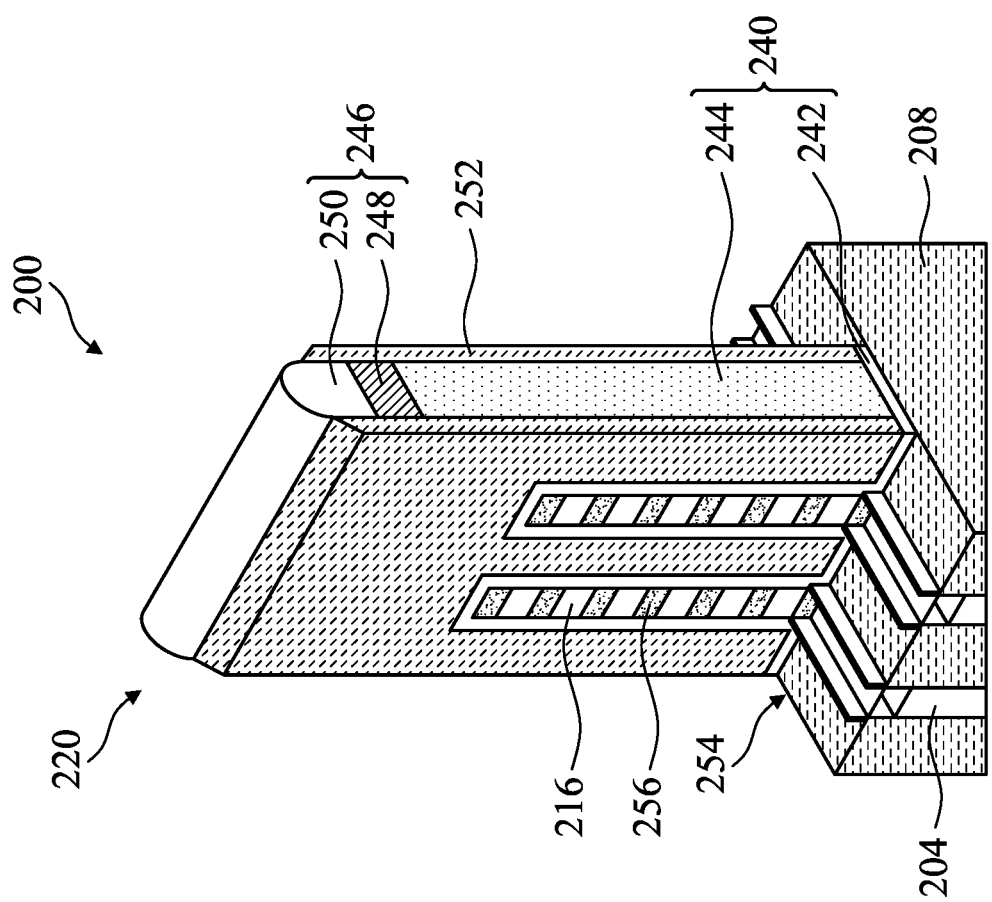
Figure 19:
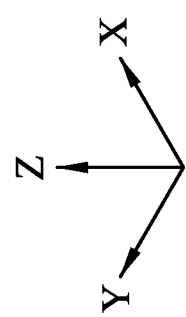

Referring to FIGS. 11 and 19, the method 1100 includes a block 1116 where inner spacers 256 are formed on lateral ends of the epitaxial layers 214. In some embodiments, a lateral etching (or horizontal recessing) is performed to recess the epitaxial layers 214 to form cavities on lateral ends of the epitaxial layers 214. The amount of etching of the epitaxial layers 214 may range from about 2 nm to about 10 nm. When the epitaxial layers 214 are SiGe, the lateral etching process may use an etchant, such as, but not limited to, ammonium hydroxide ($NH_4OH$), tetramethylammonium hydroxide (TMAH), ethylenediamine pyrocatechol (EDP), or potassium hydroxide (KOH) solutions. Subsequently, an insulating layer is deposited in the source/drain recesses 254 and fill the cavities on lateral ends of the epitaxial layers 214. The insulating layer may include a dielectric material, such as SiN, SiOC, SiOCN, SiCN, $SiO_2$, and/or other suitable material. In some embodiments, the insulating layer is conformally deposited, for example, by ALD or any other suitable method. After the conformal deposition of the insulating layer, an etch-back process is performed to partially remove the insulating layer from outside of the cavities. By this etching the insulating layer remains substantially within the cavities, thereby forming the inner spacers 256.

Figure 20:
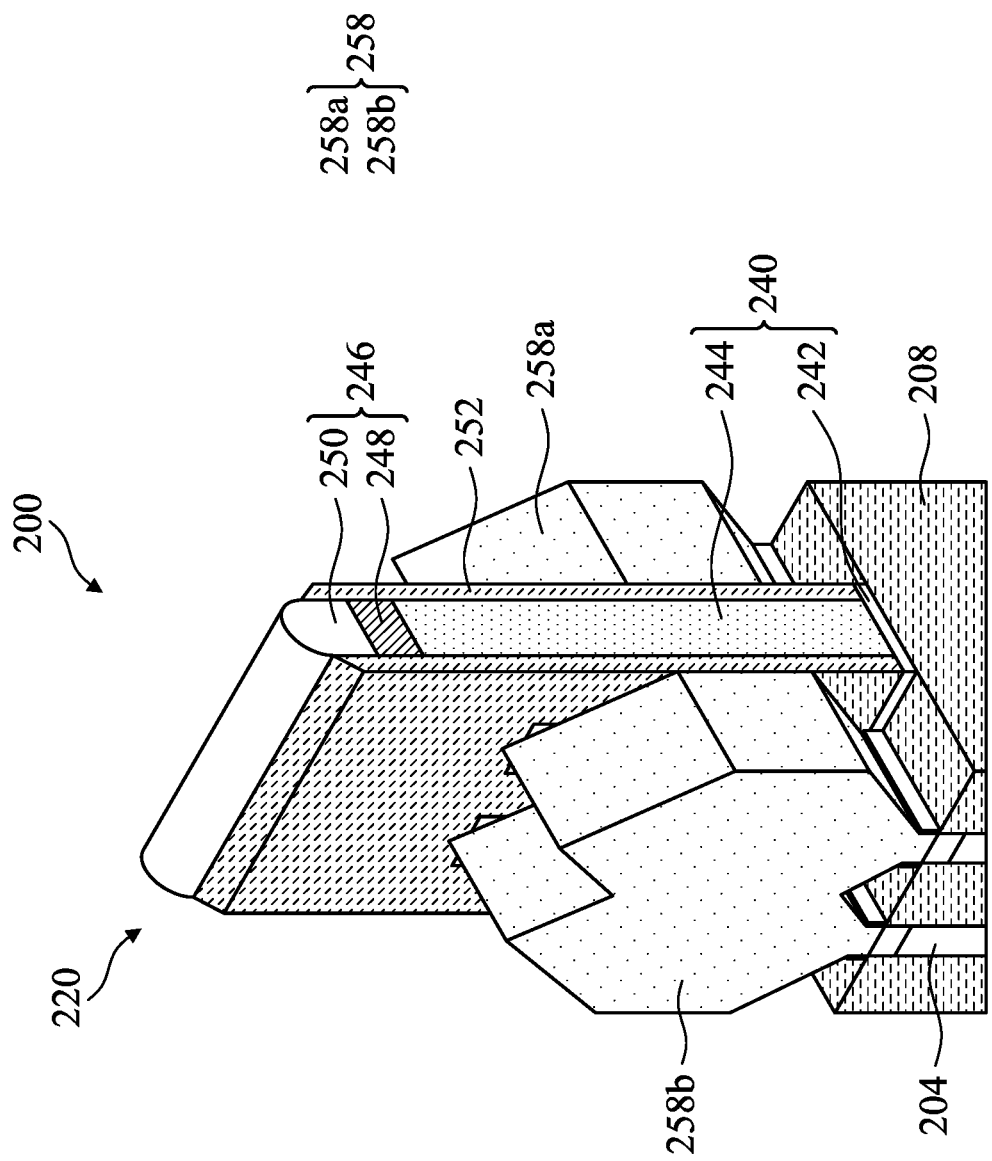

Referring to FIGS. 11 and 20, the method 1100 includes a block 1118 where source/drain features 258 are formed. The source/drain features 258 are selectively and epitaxially deposited in the source/drain recesses 254. The source/drain features 258 may be deposited using an epitaxial process, such as vapor-phase epitaxy (VPE), ultra-high vacuum CVD (UHV-CVD), molecular beam epitaxy (MBE), and/or other suitable processes. Depending on the design of the workpiece 200, the source/drain features 258 may be n-type or p-type. When the source/drain features 258 are n-type, they may include silicon (Si) doped with an n-type dopant, such as phosphorus (P) or arsenic (As). When the source/drain features 258 are p-type, they may include silicon germanium (SiGe) doped with a p-type dopant, such as boron (B) or gallium (Ga). Doping of the source/drain features 258 may be performed either in situ with their deposition or ex situ using an implantation process, such as a junction implant process. Also as shown in FIG. 20, the source/drain features 258 includes a first source/drain feature 258a formed on the middle portion 220a of the X-shape fin-like structure 220 and second source/drain features 258b formed on the corner portions 220b of the X-shape fin-like structure 220. The one first source/drain feature 258a is on one side of the dummy gate stack 240. The two second source/drain features 258b are on the other side of the dummy gate stack 240. Since the middle portion 220a has a larger width, the first source/drain feature 258a has a larger width and a larger volume than each of the two second source/drain feature 258b. Further, the two second source/drain feature 258b may be laterally merged (in the Y-direction), such as depicted in FIG. 20. Alternatively, the two second source/drain feature 258b may remain separated.

Figure 21:
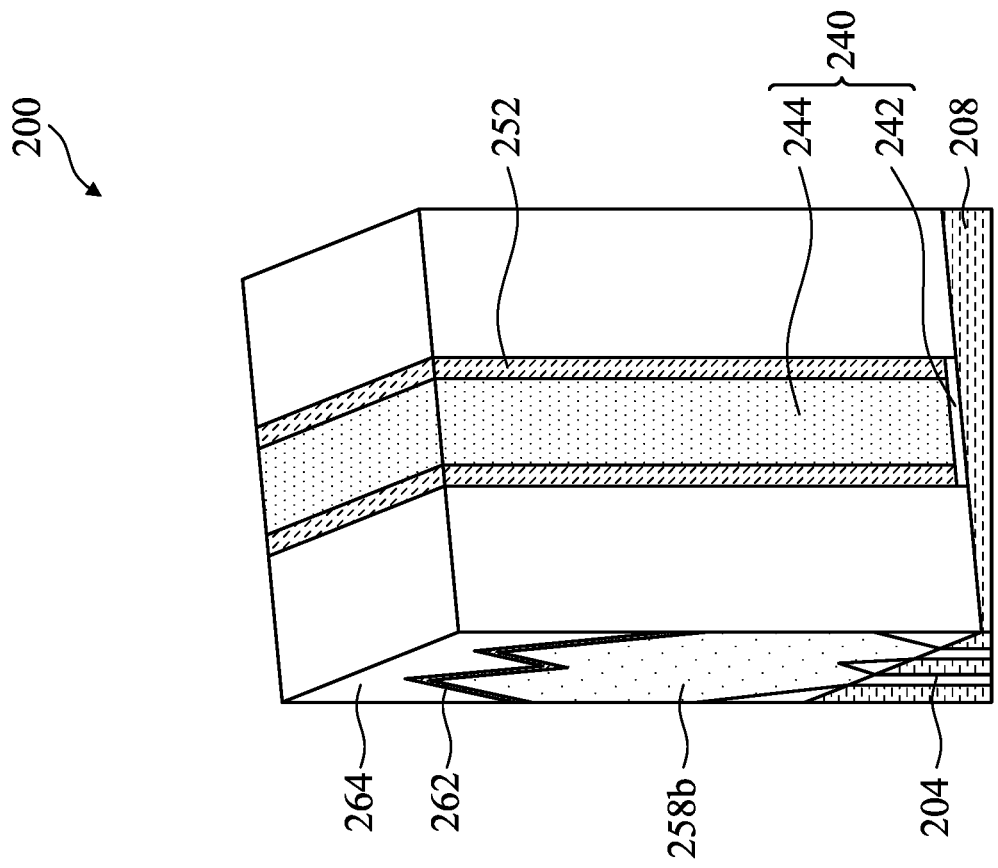

Referring to FIGS. 11 and 21, the method 1100 includes a block 1120 where a contact etch stop layer (CESL) 262 and an interlayer dielectric (ILD) layer 264 are deposited on the workpiece 200. In an example process, the CESL 262 is first conformally deposited over the workpiece 200 and then the ILD layer 264 is deposited over the CESL 262. The CESL 262 may include silicon nitride, silicon oxide, silicon oxynitride, and/or other materials known in the art. The CESL 262 may be deposited using ALD, plasma-enhanced chemical vapor deposition (PECVD) process and/or other suitable deposition or oxidation processes. In some embodiments, the ILD layer 264 includes materials such as SiCN, SiON, SiOCN, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 264 may be deposited by spin-on coating, an FCVD process, or other suitable deposition technique. In some embodiments, after formation of the ILD layer 264, the workpiece 200 may be annealed to improve integrity of the ILD layer 264. To remove excess materials (including the gate top hard mask 246) and to expose top surfaces of the dummy electrode 244 of the dummy gate stack 240, a planarization process (such as a CMP process) may be performed to the workpiece 200 to provide a planar top surface. Top surfaces of the dummy electrodes 244 are exposed on the planar top surface.

Figure 22:
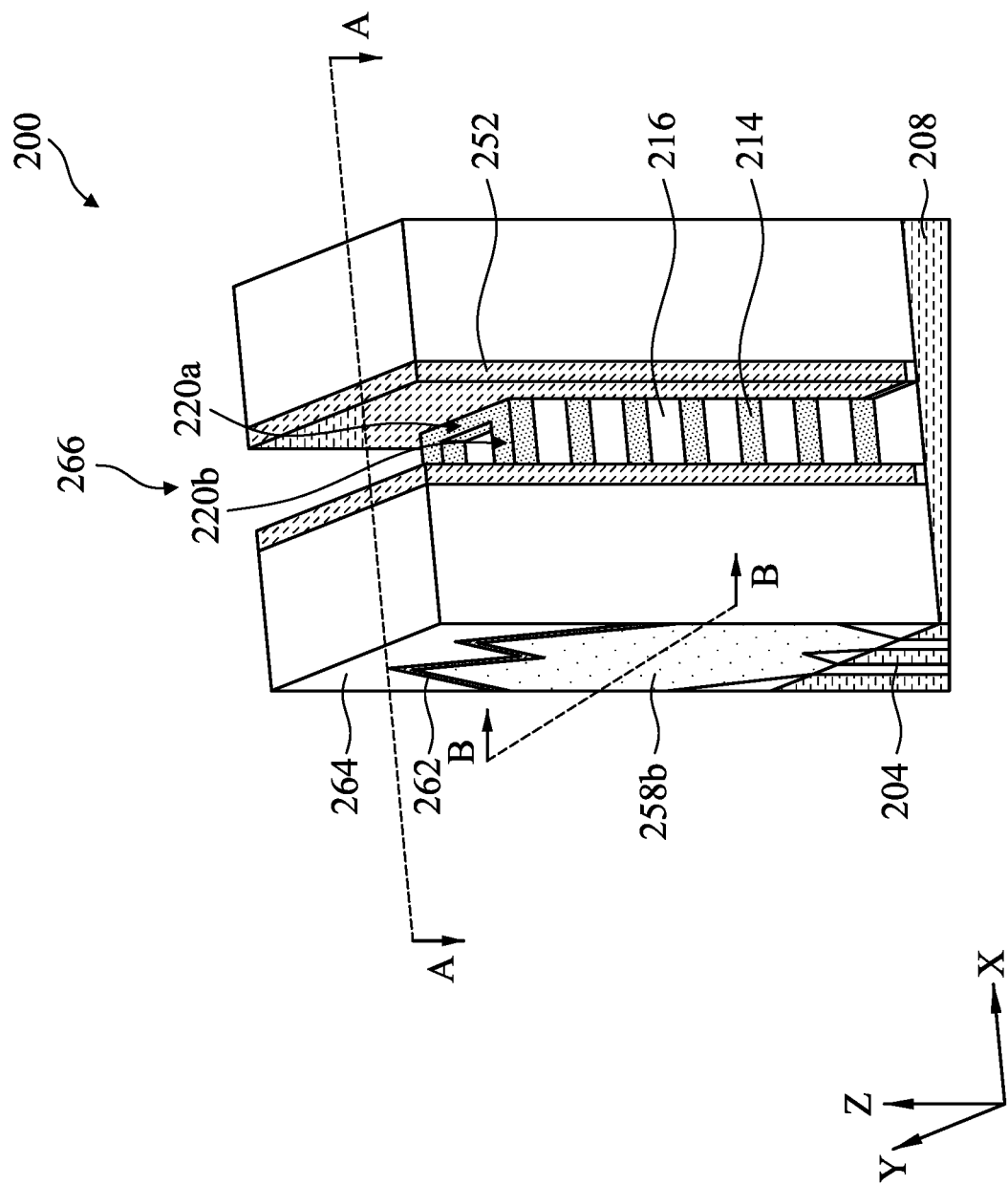

Referring to FIGS. 11 and 22, the method 1100 includes a block 1122 where the dummy gate stack 240 is removed. The dummy gate stack 240 exposed at the conclusion of the block 1120 is removed from the workpiece 200 by a selective etching process. The selective etching process may be a selective wet etching process, a selective dry etching process, or a combination thereof.

In the depicted embodiment, the selective etching process selectively removes the dummy dielectric layer 242 and the dummy electrode 244 without substantially damaging the channel layers 216, the sacrificial layers 214, and the gate spacers 252. The removal of the dummy gate stack 240 results in a gate trench 266 exposing the middle portion 220a and two corner portions 220b of the channel region in the X-shape active region.

Figure 23B:
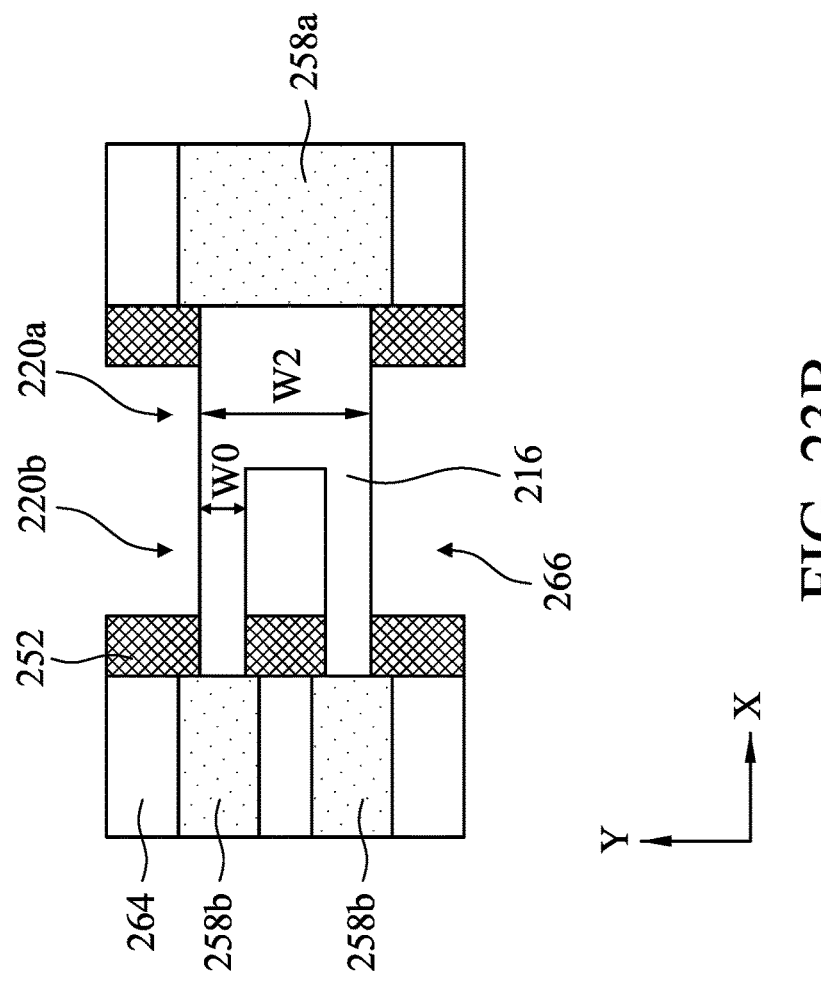
FIGS. 23A, 23B, 24A, and 24B illustrate fragmentary cross-sectional views of a workpiece during a fabrication process according to the method of FIG. 11, according to one or more aspects of the present disclosure.
Figure 23A:
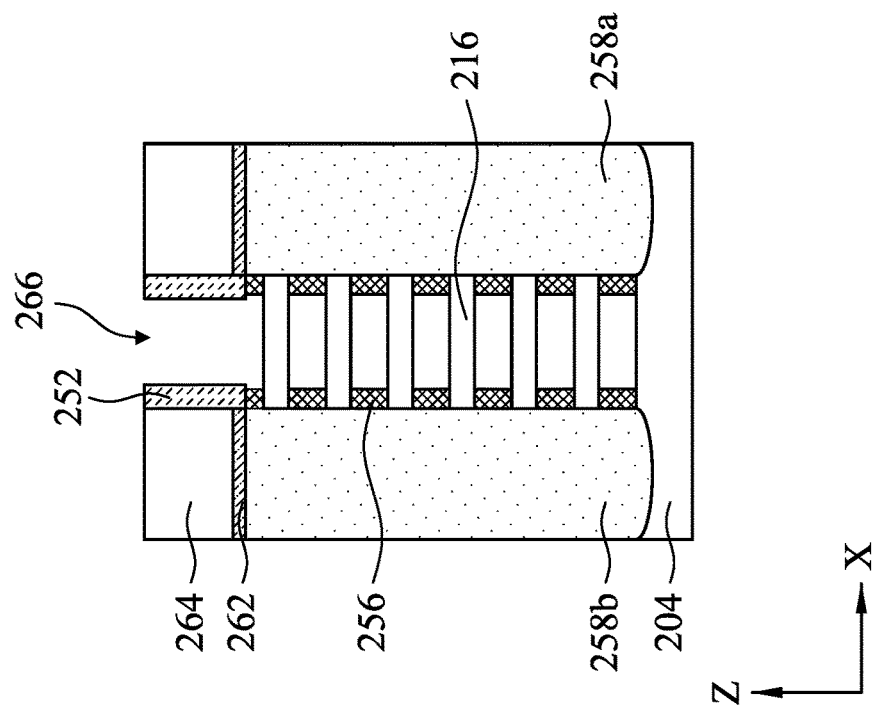

Referring to FIGS. 11 and 23A-B, the method 1100 includes a block 1124 where the channel layers 216 is released in the gate trench 266. FIG. 23A is a cross-sectional view in the X-Z plane of the workpiece 200 along the A-A line in FIG. 22. FIG. 23B is a plane view in the X-Y plane of the workpiece 200 along the B-B line in FIG. 22. In the depicted embodiment, the release of the channel layers 216 includes a selective etching process that selectively removes the sacrificial layers 214 from the gate trench 266. The released channel layers 216 are also denoted as the channel members 216. In the depicted embodiment where the channel members 216 resemble a sheet or a nanosheet, the channel member release process may also be referred to as a sheet formation process. The channel members 216 are vertically stacked along the Z direction. The selective removal of the sacrificial layers 214 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$.

Figure 24B:
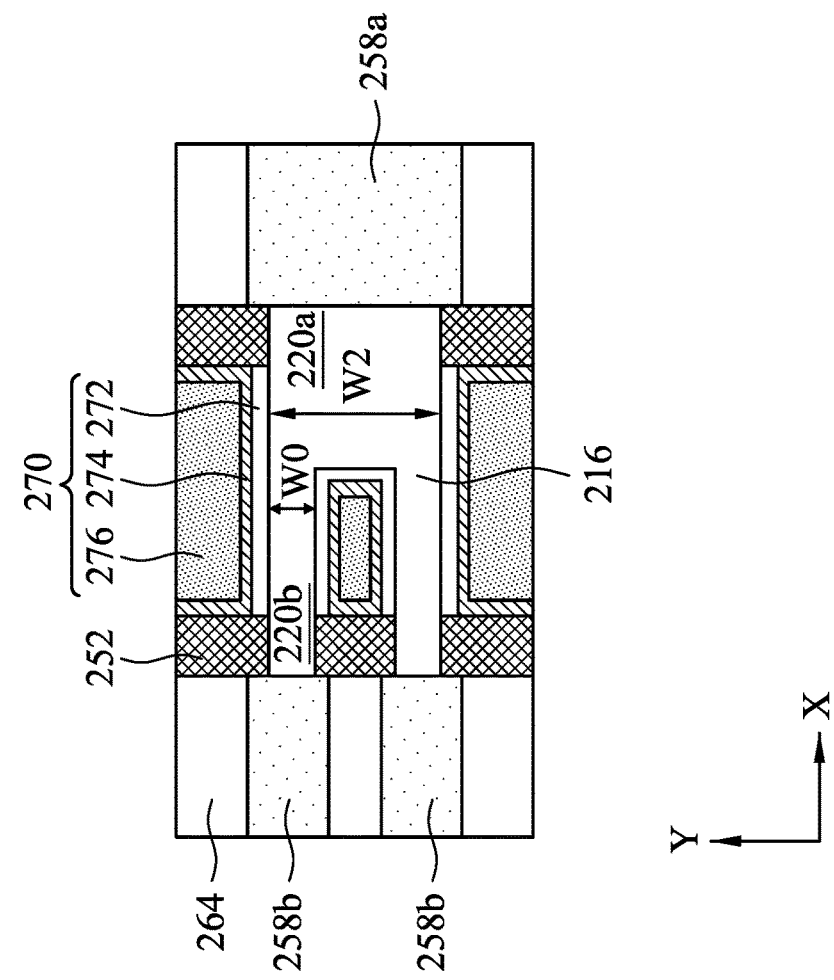
Figure 24A:
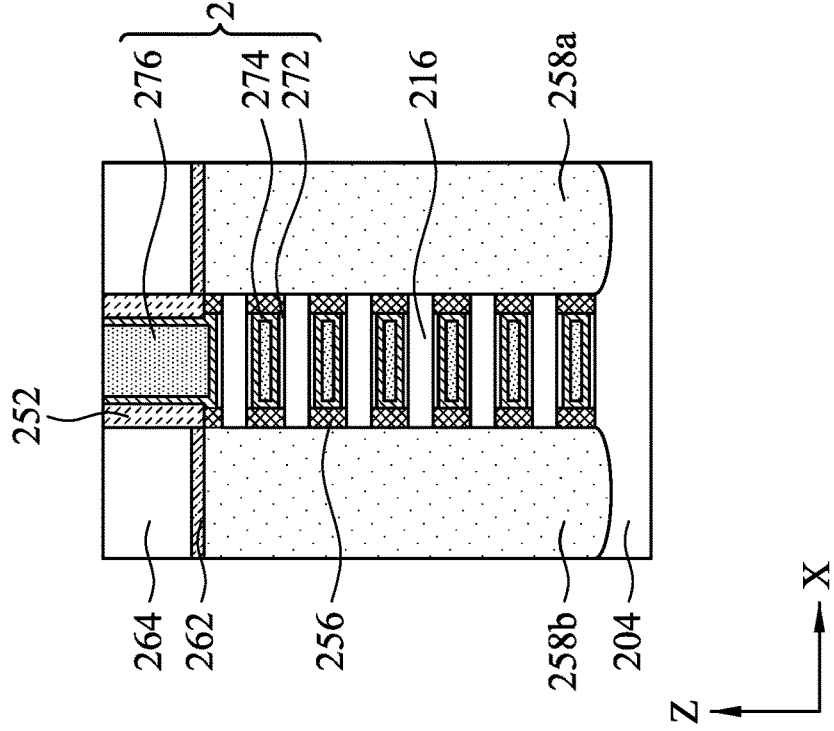

Referring to FIGS. 11 and 24A-B, the method 1100 includes a block 1126 where gate structure 270 (also known as functional gate structure 270 or metal gate structure 270) are formed in the gate trenches 266 to engage each of the channel members 216. Particularly, each of the middle portion 220a and the two corner portions 220b of the channel members 216 is wrapped around by the gate structure 270. FIG. 24A is a cross-sectional view in the X-Z plane of the workpiece 200 along the A-A line in FIG. 22. FIG. 24B is a plane view in the X-Y plane of the workpiece 200 along the B-B line in FIG. 22.

Each of the gate structures 270 includes an interfacial layer 272 disposed on the channel members 216, a high-k dielectric layer 274 disposed on the interfacial layer 272, and a gate electrode layer 276 over the high-k dielectric layer 274. The interfacial layer 272 and the high-k dielectric layer 274 are collectively referred to as a gate dielectric layer. The interfacial layer 272 may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed semiconductive surfaces of the channel members 216 to form the interfacial layer. The high-k dielectric layer 274 is then deposited over the interfacial layer 272 using ALD, CVD, and/or other suitable methods. The high-k dielectric layer 274 includes high-K dielectric materials. In one embodiment, the high-k dielectric layer 274 may include hafnium oxide. Alternatively, the high-k dielectric layer 274 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

After the formation of the high-k dielectric layer 274, the gate electrode layer 276 is deposited over the high-k dielectric layer 274. The gate electrode layer 276 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 276 may be formed by ALD, PVD, CVD, e-beam evaporation, or other suitable process.

The workpiece 200 may undergo further processing to form various features and regions known in the art. For example, subsequent processing may form various contacts, vias, metal lines, and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1100, and some process steps described above may be replaced or eliminated in accordance with various embodiments of the method 1100.

Although not intended to be limiting, embodiments of the present disclosure provide one or more of the following advantages. For example, embodiments of the present disclosure form flexible sheet structures for active regions, providing channel regions with different widths. This advantageously meets various requirements of transistors for different applications. Further, embodiments of the present disclosure can be readily integrated into existing semiconductor manufacturing processes.

In one exemplary aspect, the present disclosure is directed to a method. The method includes patterning a top portion of a substrate, thereby forming a fin-like structure protruding from the substrate, the fin-like structure having a first portion with a first width and a second portion with a second width that is smaller than the first width, forming a dummy gate structure across the fin-like structure, the dummy gate structure being directly above the first portion and the second portion of the fin-like structure, thereby defining a channel region with a first width and a second width, recessing the fin-like structure with the dummy gate structure as an etch mask, thereby forming recesses on both sides of the dummy gate structure, growing epitaxial features in the recesses, the epitaxial features abutting the first and second portions of the fin-like structure on the both sides of the dummy gate structure, and replacing the dummy gate structure with a metal gate structure, the metal gate structure engaging both the first portion and the second portion of the fin-like structure. In some embodiments, the patterning of the top portion of the substrate includes forming a patterned mask layer over the substrate, the patterned mask layer including a first portion with the first width and a second portion with the second width, and etching the top portion of the substrate through openings in the patterned mask layer. In some embodiments, a ratio of the second width to the first width ranges from about 30% to about 90%. In some embodiments, the first width is about twice of the second width. In some embodiments, the epitaxial features include a first epitaxial feature over the first portion of the fin-like structure and a second epitaxial feature over the second portion of the fin-like structure, and the first epitaxial feature has a width larger than the second epitaxial feature. In some embodiments, the first epitaxial feature has a volume larger than the second epitaxial feature. In some embodiments, the fin-like structure has a third portion with a third width that is smaller than the first width, the third portion and the second portion both connect to the first portion, and the metal gate structure also engages the third portion. In some embodiments, the second and third portions of the fin-like structure elongate in a same direction and are parallel with each other. In some embodiments, the fin-like structure includes channel layers and sacrificial layers alternatingly disposed in a vertical direction, further includes removing the sacrificial layers, such that the metal gate structure wraps around each of the channel layers. In some embodiments, the dummy gate structure is a first dummy gate structure and the metal gate structure is a first metal gate structure, further includes forming a second dummy gate structure across the first portion of the fin-like structure, forming a third dummy gate structure across the second portion of the fin-like structure, replacing the second dummy gate structure with a second metal gate structure, the second metal gate structure engaging the first portion of the fin-like structure, and replacing the third dummy gate structure with a third metal gate structure, the third metal gate structure engaging the second portion of the fin-like structure.

In another exemplary aspect, the present disclosure is directed to a method. The method includes receiving a first layout of a standard cell, the first layout of the standard cell including a strip corresponding to an active region of an integrated circuit, creating a second layout, at least a portion of the second layout including repeating the first layout of the standard cell in a first direction thereby connecting multiple strips into a larger strip elongating in the first direction, performing a standard cell adjustment process, such that a width or a position of the strip in at least one of the standard cells is adjusted, resulting the larger strip having a first segment of a first width and a second segment of a second width that is different from the first width, and providing the second layout for fabricating a mask in association with the integrated circuit. In some embodiments, the standard cell adjustment process includes increasing or decreasing the width of the strip. In some embodiments, the standard cell adjustment process includes offsetting the strip such that the strip connects to another strip in an adjacent standard cell. In some embodiments, the at least one of the standard cells is selected based on a speed or power requirement of the integrated circuit. In some embodiments, the second layout includes a shape corresponding to a gate region of the integrated circuit, the shape overlapping with both the first segment and the second segment of the larger strip. In some embodiments, a ratio of the second width to the first width ranges from about 30% to about 90%.

In another exemplary aspect, the present disclosure is directed to a semiconductor device. The semiconductor device includes a plurality of channel members vertically stacked above a substrate, a gate structure wrapping around each of the channel members, a first epitaxial feature abutting the channel members from a first side of the gate structure, and a second epitaxial feature abutting the channel members from a second side of the gate structure. Between the first and second epitaxial features the channel members have a first width and a second width that is different from the first width in a plan view. In some embodiments, the first and second epitaxial features have different widths and volumes. In some embodiments, a transition from the first width to the second width includes a step-profile. In some embodiments, the semiconductor device further includes a third epitaxial feature abutting the channel members from the second side of the gate structure. The second epitaxial feature and the third epitaxial feature have a same width that is smaller than the first epitaxial feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   patterning a top portion of a substrate, thereby forming a fin-like structure protruding from the substrate, wherein the fin-like structure has a first portion with a first width and a second portion with a second width that is smaller than the first width;
   forming a dummy gate structure across the fin-like structure, wherein the dummy gate structure is directly above the first portion and the second portion of the fin-like structure, thereby defining a channel region with the first width and the second width;
   recessing the fin-like structure with the dummy gate structure as an etch mask, thereby forming recesses on both sides of the dummy gate structure;
   growing epitaxial features in the recesses, wherein the epitaxial features abut the first and second portions of the fin-like structure on the both sides of the dummy gate structure; and replacing the dummy gate structure with a metal gate structure, wherein the metal gate structure engages both the first portion and the second portion of the fin-like structure.

2. The method of claim 1, wherein the patterning of the top portion of the substrate includes:
forming a patterned mask layer over the substrate, wherein the patterned mask layer includes a first portion with the first width and a second portion with the second width; and
etching the top portion of the substrate through openings in the patterned mask layer.

3. The method of claim 1, wherein a ratio of the second width to the first width ranges from about 30% to about 90%.

4. The method of claim 3, wherein the first width is about twice of the second width.

5. The method of claim 1, wherein the epitaxial features include a first epitaxial feature over the first portion of the fin-like structure and a second epitaxial feature over the second portion of the fin-like structure, and wherein the first epitaxial feature has a width larger than the second epitaxial feature.

6. The method of claim 5, wherein the first epitaxial feature has a volume larger than the second epitaxial feature.

7. The method of claim 1, wherein the fin-like structure has a third portion with a third width that is smaller than the first width, the third portion and the second portion both connect to the first portion, and the metal gate structure also engages the third portion.

8. The method of claim 7, wherein the second and third portions of the fin-like structure elongate in a same direction and are parallel with each other.

9. The method of claim 1, wherein the fin-like structure includes channel layers and sacrificial layers alternatingly disposed in a vertical direction, further comprising:
removing the sacrificial layers, such that the metal gate structure wraps around each of the channel layers.

10. The method of claim 1, wherein the dummy gate structure is a first dummy gate structure and the metal gate structure is a first metal gate structure, further comprising:
forming a second dummy gate structure across the first portion of the fin-like structure;
forming a third dummy gate structure across the second portion of the fin-like structure;
replacing the second dummy gate structure with a second metal gate structure, wherein the second metal gate structure engages the first portion of the fin-like structure; and
replacing the third dummy gate structure with a third metal gate structure, wherein the third metal gate structure engages the second portion of the fin-like structure.

11. A method, comprising:
receiving a first layout of a standard cell, wherein the first layout of the standard cell includes a first strip corresponding to an active region of an integrated circuit, the first strip elongating in a first direction to an edge of the first layout of the standard cell;
creating a second layout, wherein at least a portion of the second layout includes repeating the first layout of the standard cell in the first direction thereby connecting multiple first strips into a larger and continuous second strip elongating in the first direction, the second strip corresponding to a continuous active region for multiple transistors disposed along the first direction;
performing a standard cell adjustment process, such that a width or a position of the first strip in at least one of the standard cells is adjusted, resulting the second strip having a first segment of a first width and a second segment of a second width that is different from the first width; and
providing the second layout for fabricating a mask in association with the integrated circuit.

12. The method of claim 11, wherein the standard cell adjustment process includes increasing or decreasing the width of the first strip in the at least one of the standard cells.

13. The method of claim 11, wherein the standard cell adjustment process includes offsetting the first strip in the at least one of the standard cells along a second direction perpendicular to the first direction, such that the first strip connects to another first strip in an adjacent standard cell.

14. The method of claim 11, wherein the at least one of the standard cells is selected based on a speed or power requirement of the integrated circuit.

15. The method of claim 11, wherein the second layout includes a shape corresponding to a gate region of the integrated circuit, wherein the shape overlaps with both the first segment and the second segment of the larger second strip.

16. The method of claim 11, wherein a ratio of the second width to the first width ranges from about 30% to about 90%.

17. A method, comprising:
forming a fin-like structure protruding from a substrate, the fin-like structure having a center portion and four corner portions extending from the center portion, the center portion is wider than each of the corner portions;
forming a dummy gate structure across the center portion and at least two of the corner portions of the fin-like structure;
forming first and second epitaxial features over the two of the corner portions and a third epitaxial feature over the center portion; and
replacing the dummy gate structure with a metal gate structure.

18. The method of claim 17, wherein the third epitaxial feature has a larger volume than the first and second epitaxial features.

19. The method of claim 17, wherein the two of the corner portions are disposed on a same side of the dummy gate structure.

20. The method of claim 17, wherein the dummy gate structure is a first dummy gate structure and the metal gate structure is a first metal gate structure, the method further comprising:
forming a second dummy gate structure across the center portion and other two of the corner portions of the fin-like structure; and
replacing the second dummy gate structure with a second metal gate structure.

* * * * *